(12) United States Patent
Nishio et al.

(10) Patent No.: US 12,281,254 B2
(45) Date of Patent: Apr. 22, 2025

(54) ALUMINA-BASED THERMALLY CONDUCTIVE OXIDE AND METHOD FOR PRODUCING SAME

(71) Applicant: DAINICHISEIKA COLOR & CHEMICALS MFG. CO., LTD., Tokyo (JP)

(72) Inventors: Akira Nishio, Tokyo (JP); Kenichi Yamane, Tokyo (JP); Naotsugu Yamamura, Tokyo (JP); Shingo Tominaga, Tokyo (JP); Hiroya Oniduka, Tokyo (JP)

(73) Assignee: DAINICHISEIKA COLOR & CHEMICALS MFG. CO., LTD., Tokyo (JP)

( * ) Notice: Subject to any disclaimer, the term of this patent is extended or adjusted under 35 U.S.C. 154(b) by 0 days.

(21) Appl. No.: 16/486,793

(22) PCT Filed: Feb. 27, 2018

(86) PCT No.: PCT/JP2018/007251
§ 371 (c)(1),
(2) Date: Aug. 16, 2019

(87) PCT Pub. No.: WO2018/159608
PCT Pub. Date: Sep. 7, 2018

(65) Prior Publication Data
US 2019/0359875 A1    Nov. 28, 2019

(30) Foreign Application Priority Data
Mar. 2, 2017 (JP) .................... 2017-038977

(51) Int. Cl.
| | | |
|---|---|---|
| C09K 5/14 | (2006.01) | |
| C08K 3/22 | (2006.01) | |
| C08K 3/26 | (2006.01) | |
| C08K 3/32 | (2006.01) | |
| C08K 3/40 | (2006.01) | |
| C09D 5/00 | (2006.01) | |
| C09D 7/61 | (2018.01) | |
| C09D 11/037 | (2014.01) | |
| C09J 11/04 | (2006.01) | |
| H01L 23/00 | (2006.01) | |
| H01L 23/373 | (2006.01) | |

(52) U.S. Cl.
CPC .................. *C09K 5/14* (2013.01); *C08K 3/22* (2013.01); *C08K 3/26* (2013.01); *C08K 3/32* (2013.01); *C08K 3/40* (2013.01); *C09D 5/00* (2013.01); *C09D 7/61* (2018.01); *C09D 11/037* (2013.01); *C09J 11/04* (2013.01); *H01L 23/3737* (2013.01); *H01L 24/29* (2013.01); *C08K 2003/2227* (2013.01); *C08K 2003/2241* (2013.01); *C08K 2003/2258* (2013.01); *C08K 2003/2296* (2013.01); *C08K 2003/324* (2013.01); *C08K 2201/001* (2013.01); *H01L 2224/2929* (2013.01); *H01L 2224/29387* (2013.01); *H01L 2924/05432* (2013.01)

(58) Field of Classification Search
None
See application file for complete search history.

(56) References Cited

U.S. PATENT DOCUMENTS

| | | | | |
|---|---|---|---|---|
| 3,271,171 A | * | 9/1966 | Burgyan | ............... C09C 1/0009 428/428 |
| 4,487,756 A | | 12/1984 | Mizrah et al. | |

(Continued)

FOREIGN PATENT DOCUMENTS

| | | |
|---|---|---|
| CN | 102363577 | 2/2012 |
| CN | 103553096 | 2/2014 |

(Continued)

OTHER PUBLICATIONS

Improvement of the Compositions and Properties of Gray Ceramic Pigmentsa. V. Zaichuk, and Ya. I. Belyi ; Glass and Ceramics, vol. 70, Nos. 5-6, Sep. 2013 (Russian Original, Nos. 5-6, May-Jun. 2013); Translated from Steklo i Keramika, No. 6, pp. 32-37, Jun. 2013. (Year: 2013).*
WO 2014136773 A1 Bib Data and Translation (Year: 2013).*
Bib data and translation—WO2017/047452A1 ; Oniduka Hiroya; Mar. 2017; (Year: 2017).*
Derwent Abstract, Bib Data and translation; JP-10044585-A; Tanuma, Toshihiro; Feb. 1998 (Year: 1998).*

(Continued)

*Primary Examiner* — Humera N. Sheikh
*Assistant Examiner* — Elizabeth D Ivey
(74) *Attorney, Agent, or Firm* — HSML P.C.

(57) ABSTRACT

Provided is an alumina-based thermally conductive oxide which has not only an excellent thermal conductivity but also excellent chemical resistance, water-fastness, and electrical insulation property, while exhibiting a satisfactory kneadability (miscibility) into a resin and being capable of producing materials and articles, such as a resin composition, having an excellent shapability. Specifically, the present invention is an alumina-based thermally conductive oxide which is obtained by firing a starting material mixture that contains an aluminum starting material. The aluminum starting material is at least one selected from the group consisting of boehmite, aluminum hydroxide, and alumina; the starting material mixture further contains a boric acid compound and an oxide starting material such as a tungsten compound; and the content of the boric acid compound in the starting material mixture is 0.1 to 5 parts by mass, and the content of the oxide starting material in the starting material mixture is 0.1 to 20 parts by mass each based on 100 parts by mass of the aluminum starting material.

17 Claims, No Drawings

(56) References Cited

U.S. PATENT DOCUMENTS

| | | | | |
|---|---|---|---|---|
| 5,935,550 A | * | 8/1999 | Mohri | C01F 7/32 423/625 |
| 2001/0027623 A1 | | 10/2001 | Rosenflanz | |
| 2005/0035230 A1 | * | 2/2005 | Kanbara | C08K 3/22 241/23 |
| 2005/0182172 A1 | | 8/2005 | Kamimura et al. | |
| 2006/0189740 A1 | * | 8/2006 | Kamimura | C01F 7/02 423/625 |
| 2009/0320719 A1 | * | 12/2009 | Lee | C01G 9/00 106/404 |
| 2011/0251042 A1 | | 10/2011 | Araki et al. | |
| 2014/0322534 A1 | | 10/2014 | Suzuki et al. | |
| 2015/0045490 A1 | * | 2/2015 | Riebel | C08J 3/18 524/313 |
| 2016/0264832 A1 | * | 9/2016 | Yuan | C08K 3/22 |
| 2016/0369148 A1 | * | 12/2016 | Nishio | C09K 5/14 |
| 2017/0158807 A1 | * | 6/2017 | Yoshimoto | C08K 9/08 |
| 2018/0244578 A1 | | 8/2018 | Nishio et al. | |

FOREIGN PATENT DOCUMENTS

| | | | | | |
|---|---|---|---|---|---|
| CN | 104987112 | | 10/2015 | | |
| CN | 104987112 A | * | 10/2015 | | |
| CN | 105174921 | | 12/2015 | | |
| CN | 105658715 | | 6/2016 | | |
| CN | 108025980 | | 5/2018 | | |
| EP | 3272709 | | 1/2018 | | |
| JP | 51-056813 | | 5/1976 | | |
| JP | S59-097528 | | 6/1984 | | |
| JP | 62-191420 | | 8/1987 | | |
| JP | 63-319298 | | 12/1988 | | |
| JP | 63-319299 | | 12/1988 | | |
| JP | 04-021640 | | 4/1992 | | |
| JP | 04-022880 | | 4/1992 | | |
| JP | 05-170449 | | 7/1993 | | |
| JP | 07-206432 | | 8/1995 | | |
| JP | H7-206430 | | 8/1995 | | |
| JP | 10044585 A | * | 2/1998 | | |
| JP | 2002-348116 | | 12/2002 | | |
| JP | 2003-002642 | | 1/2003 | | |
| JP | 2003-192339 | | 7/2003 | | |
| JP | 2003-521435 | | 7/2003 | | |
| JP | 2004-027177 | | 1/2004 | | |
| JP | 2005-022963 | | 1/2005 | | |
| JP | 3744010 | | 12/2005 | | |
| JP | 3850371 | | 11/2006 | | |
| JP | 2007-045876 | | 2/2007 | | |
| JP | 2007-070608 | | 3/2007 | | |
| JP | 2007-169516 | | 7/2007 | | |
| JP | 2008-127257 | | 6/2008 | | |
| JP | 2011-219301 | | 11/2011 | | |
| JP | 2014-009140 | | 1/2014 | | |
| JP | 2014-218424 | | 11/2014 | | |
| JP | 2015-10200 | | 1/2015 | | |
| JP | 2015-034269 | | 2/2015 | | |
| JP | 5720848 | | 5/2015 | | |
| JP | 2016-135841 | | 7/2016 | | |
| JP | 5975182 | | 8/2016 | | |
| TW | 201609943 | | 3/2016 | | |
| TW | 201609943 A | * | 3/2016 | | C08G 59/245 |
| WO | 2001/056946 | | 8/2001 | | |
| WO | 02/098796 | | 12/2002 | | |
| WO | 2013039103 | | 3/2013 | | |
| WO | 2013084750 | | 6/2013 | | |
| WO | 2014/051091 | | 4/2014 | | |
| WO | WO-2014136773 A1 | * | 9/2014 | | C09J 9/00 |
| WO | 2015/060125 | | 4/2015 | | |
| WO | 2015/137468 | | 9/2015 | | |
| WO | WO-2017047452 A1 | * | 3/2017 | | C09D 11/03 |

OTHER PUBLICATIONS

CN104987112 A From IDS—translation; Dong Z; Oct. 2015 (Year: 2015).*
International Search Report, issued in the corresponding PCT application No. PCT/JP2018/007251, mailed on Mar. 27, 2018, 6 pages.
Indian Examination Report, issued in the corresponding Indian patent application No. 201917033773, dated Mar. 9, 2020, 5 pages.
First Chinese Office Action, issued in the corresponding Chinese patent application No. 201880014859.4, dated Feb. 3, 2020, 14 pages (including machine translation).
Second Chinese Office Action, issued in the corresponding Chinese patent application No. 201880014859.4, dated Jul. 29, 2020, 13 pages (all references have been previously cited).
Extended European Search Report, issued in the corresponding European patent application No. 18761134.8, dated Sep. 16, 2020, 7 pages.
Taiwanese Office Action, issued in the corresponding Taiwanese patent application No. 107107079, dated Nov. 21, 2020, 10 pages.
Chinese Office Action, issued in the corresponding Chinese patent application No. 201680053811.5, dated May 29, 2020, 17 pages (including translation).
Indian Office Action, issued in the corresponding Indian patent application No. 201817006900, dated Oct. 16, 2019, 5 pages.
Korean Office Action Report, issued in the corresponding Korean application No. 10-2018-7007171, dated Jun. 28, 2019, 10 pages (including translation).
Extended European Search Report, issued in the corresponding European application No. 16846323.0, dated Feb. 11, 2019, 11 pages.
International Search Report, issued in the corresponding PCT application No. PCT/JP2016/076178, dated Oct. 18, 2016, 5 pages.
Second Taiwanese Office Action, issued in the corresponding Taiwanese patent application No. 107107079, dated Nov. 22, 2022, 8 pages.

* cited by examiner

ALUMINA-BASED THERMALLY CONDUCTIVE OXIDE AND METHOD FOR PRODUCING SAME

TECHNICAL FIELD

The present invention relates to an alumina-based thermally conductive oxide and a method for producing the same, and a thermally conductive composition, an article, a liquid composition, and a thermally conductive thin film each using an alumina-based thermally conductive oxide.

BACKGROUND ART

Currently, a large number of materials have been studied as thermally conductive materials. With improvements in the integration of a semiconductor element, the demand for dissipating heat has become stronger and stronger, and the development of materials having a much higher thermal conductivity and insulation property than conventional materials has become essential. As a material that satisfies such demands, a composite material (resin composition) obtained by kneading a thermally conductive filler into a resin is known.

As the filler for use in the composite material, magnesium oxide having a higher thermal conductivity than silica and having a lower hardness than alumina has been studied. Magnesium oxide has characteristics such as a high melting point, a high thermal conductivity, and a low toxicity, and is therefore widely used as a heat-resistant material or a filler. Further, improving the performance of magnesium oxide by applying various types of surface treatment has also been studied in recent years.

However, magnesium oxide has a higher hygroscopicity as compared to silica and alumina. Therefore, in a composite material using magnesium oxide as a filler, cracks are likely to occur by the volume expansion of the filler accompanying moisture absorption, so that the thermal conductivity may be lowered. Therefore, with respect to the composite material using magnesium oxide as a filler, there has been a problem in ensuring long-term stability of a semiconductor element or the like. Using zinc oxide as a filler has also been studied. However, zinc oxide has a problem that the stability to moisture and acids and the insulation property are poor.

As other thermally conductive materials for a filler, boron nitride and aluminum nitride are used. However, these materials are expensive, and it is known that aluminum nitride is inferior in water-fastness. The shape of boron nitride is scale-like, and therefore the thermal conductivity in the orientation direction is satisfactory, but the thermal conductivity in a direction perpendicular to the orientation direction cannot be said to be satisfactory so much. Moreover, even if attempts to knead boron nitride into a resin as much as possible are made, it is difficult to increase the filling amount. Therefore, there is also a problem that the high thermal conductivity of boron nitride cannot be fully utilized. On the other hand, as the thermally conductive materials other than metal oxides, there are carbon nanotubes, diamond, and metals. However, these materials have electrical conductivity and therefore cannot be used for heat dissipation for a semiconductor element or the like.

Incidentally, aluminum oxide is used in many situations because it has excellent water-fastness and acid resistance, has a satisfactory thermal conductivity, and is inexpensive. Aluminum oxide having an excellent kneadability (filling property) into a resin is desired for the purpose of improving thermal conductivity.

As a related conventional technique, there has been proposed a method for producing an $\alpha$-alumina powder having an average particle diameter of 1 to 10 μm and a D/H ratio of close to 1 by firing aluminum hydroxide (gibbsite) at 1,200° C. or higher using as a mineralizing agent an ammonium compound containing boron and/or fluorine (Patent Literature 1). In addition, there has been proposed a method for producing polyhedron-shaped $\alpha$-alumina having an average particle diameter of 0.5 to 6 μm and a D/H ratio of 1 to 3 by subjecting a mixture obtained by adding a fluorine compound or the like to an alumina starting material to high-temperature firing (Patent Literature 2). Further, there has been proposed a method for producing an $\alpha$-alumina powder composed of an $\alpha$-alumina single crystalline particle having a homogeneous polyhedron shape of octahedron or higher and having a D/H ratio of 0.5 to 5 or 1 to 30 by firing an alumina starting material such as transition alumina in an atmospheric gas containing a halogen gas (Patent Literature 3). Furthermore, there has been proposed: a method for producing a molybdenum-containing $\alpha$-alumina fine particle having as a main crystal plane a crystal plane other than the [001] plane and containing as a main component a fine particle having a polyhedron shape other than a hexagonal pyramid shape; and a resin composition using this $\alpha$-alumina fine particle (Patent Literatures 4 and 5).

With miniaturization of electronic devices, it has become difficult to provide a heat dissipation mechanism utilizing a heat sink, a fan, or the like in many cases. Therefore, a method of providing a coating layer (thermally conductive thin film) having a satisfactory thermal conductivity on the surface of a heating element has attracted attention. In a coating agent (liquid composition) for forming such a thermally conductive thin film, a resin for forming a thin film and an inorganic filler are contained in many cases.

For example, a thermally conductive resin composition containing aluminum oxide and aluminum nitride has been proposed (Patent Literature 6). In addition, a thermally conductive resin composition containing boron nitride has been proposed (Patent Literature 7). Furthermore, a heat-dissipating ink containing magnesium oxide or aluminum hydroxide has been proposed (Patent Literatures 8 and 9).

CITATION LIST

Patent Literature

Patent Literature 1: Japanese Patent Laid-Open No. 59-97528
Patent Literature 2: Japanese Patent Laid-Open No. 2008-127257
Patent Literature 3: Japanese Patent No. 3744010
Patent Literature 4: Japanese Patent No. 5720848
Patent Literature 5: Japanese Patent No. 5975182
Patent Literature 6: Japanese Patent Laid-Open No. 2015-10200
Patent Literature 7: Japanese Patent Laid-Open No. 2015-34269
Patent Literature 8: Japanese Patent Laid-Open No. 2007-45876
Patent Literature 9: Japanese Patent Laid-Open No. 2007-169516

SUMMARY OF INVENTION

Technical Problem

However, the $\alpha$-alumina powder produced by the method proposed in Patent Literature 1 inevitably has an uneven particle shape and has a wide particle size distribution. Further, it is difficult to produce an α-alumina powder having a particle diameter of 1 μm or less by this method. In addition, the α-alumina produced by the method proposed in Patent Literature 2 is limited to only α-alumina having an average particle diameter of 0.5 to 6 μm and has not been evaluated as a thermally conductive filler. Further, to carry out the production method proposed in Patent Literature 3, a firing furnace having a high air tightness, the firing furnace provided with a special mechanism for adjusting the atmosphere, is needed. Furthermore, the method is the one by which it is difficult to obtain a desired α-alumina powder because the shape is made uneven in the powder layer where the gas does not reach, and from other reasons. In addition, the α-alumina fine particle proposed in Patent Literatures 4 and 5 is heavier in terms of specific gravity than perfectly spherical alumina, and a resin composition containing this α-alumina fine particle is also heavier. Further, there is a possibility that the thermal conductivity of α-alumina is lowered.

The inorganic filler used in the resin composition proposed in Patent Literature 6 has a high hardness (Mohs hardness=8 to 9), and therefore a coating roll is easily damaged during coating. In addition, aluminum nitride easily reacts with moisture in the atmospheric air, and therefore there is also a concern that the resin in the formed thin film is easily deteriorated over time. On the other hand, boron nitride used in the resin composition proposed in Patent Literature 7 has a satisfactory thermal conductivity, but has a low hardness (Mohs hardness=2). However, the shape of boron nitride is scale-like, and the thermal conductivity of the thin film formed has therefore anisotropy, so that the thermal conductivity in the thickness direction of the thin film may be insufficient.

Magnesium oxide used in the heat-dissipating ink proposed in Patent Literature 8 has a relatively high hardness (Mohs hardness=6), and moreover, the use thereof may be limited in that the magnesium oxide has poor water-fastness and acid resistance. Aluminum hydroxide used in the heat dissipation ink proposed in Patent Literature 9 has a low thermal conductivity among thermally conductive inorganic fillers, and it is therefore necessary to increase the filling rate in order to obtain a sufficient thermal conductivity. Accordingly, the content ratio of a resin in a thin film to be formed will be relatively decreased, so that there is a concern over deterioration in the film-forming property and in the adhesiveness to a substrate.

The present invention has been made in view of the problems of the conventional techniques, and an object of the present invention is to provide: an alumina-based thermally conductive oxide which has not only an excellent thermal conductivity but also excellent chemical resistance, water-fastness, and electrical insulation property, while exhibiting a satisfactory kneadability (miscibility) into a resin and being capable of producing materials and articles, such as a resin composition, having an excellent shapability; and a method for producing the alumina-based thermally conductive oxide. Another object of the present invention is to provide a thermally conductive composition and an article each using the alumina-based thermally conductive oxide.

A still another object of the present invention is to provide: a liquid composition capable of forming a thermally conductive thin film having excellent thermal conductivity, chemical resistance, and adhesiveness to various base materials and having a satisfactory handling property; a thermally conductive thin film formed using this liquid composition; and a member for an electronic device, the member provided with this thermally conductive thin film.

Solution to Problem

That is, according to the present invention, an alumina-based thermally conductive oxide described below is provided.

[1] An alumina-based thermally conductive oxide obtained by firing a starting material mixture containing an aluminum starting material, wherein the aluminum starting material is at least one selected from the group consisting of boehmite, aluminum hydroxide, and alumina, the starting material mixture further contains: a boric acid compound; and at least one oxide starting material selected from the group consisting of a tungsten compound, a bismuth compound, a vanadium compound, a titanium compound, a frit, a phosphorus compound, a zinc compound, and a cerium compound, and, in the staring material mixture, a content of the boric acid compound is 0.1 to 5 parts by mass, and a content of the oxide starting material is 0.1 to 20 parts by mass each based on 100 parts by mass of the aluminum starting material.

[2] The alumina-based thermally conductive oxide according to [11], wherein the oxide starting material is a metal oxide, hydroxide, oxoate, carbonate, bicarbonate, or ammonium salt producing an oxide by pyrolysis or phase transfer.

[3] The alumina-based thermally conductive oxide according to [1] or [2], containing at least one element selected from the group consisting of iron, cobalt, copper, manganese, nickel, and chromium, and being colored.

[4] The alumina-based thermally conductive oxide according to any one of [1] to [3], wherein the frit is a non-colored grade frit not containing Pb, the non-colored grade frit containing Si and further containing at least one element selected from the group consisting of Li, B, Na, K, Mg, Ca, Al, Zn, F, Ti, Zr, and P.

[5] The alumina-based thermally conductive oxide according to any one of [1] to [4], wherein a shape of the aluminum starting material is a particle having a number average particle diameter of 0.1 to 80 μm.

Further, according to the present invention, a method for producing an alumina-based thermally conductive oxide, the method described below, is provided.

[6] A method for producing the alumina-based thermally conductive oxide according to any one of [1] to [5], the method including: a step of obtaining a starting material mixture by mixing at least one aluminum starting material selected from the group consisting of boehmite, aluminum hydroxide, and alumina, a boric acid compound, and at least one oxide starting material selected from the group consisting of a tungsten compound, a bismuth compound, a vanadium compound, a titanium compound, a frit, a phosphorus compound, a zinc compound, and a cerium compound; and a step of firing the starting material mixture obtained, wherein, in the starting material mixture, a content of the boric acid compound is 0.1 to 5 parts by mass, and a content of the oxide starting material is 0.1 to 20 parts by mass each based on 100 parts by mass of the aluminum starting material.

[7] The method for producing the alumina-based thermally conductive oxide according to [6], wherein the starting material mixture is fired at 600 to 1,500° C. in air.

[8] The method for producing the alumina-based thermally conductive oxide according to [6] or [7], wherein the starting material mixture is obtained by mixing the aluminum starting material, the boric acid compound, and the oxide starting material by a dry process.

Further, according to the present invention, a thermally conductive composition and an article each described below are provided.

[9] A thermally conductive composition containing: the alumina-based thermally conductive oxide according to any one of [1] to [5]; and a thermally conductive filler.

[10] An article containing the alumina-based thermally conductive oxide according to any one of [1] to [5].

[11] The article according to [10], further containing a thermally conductive filler.

[12] The article according to [10] or [11], being any one of a gravure ink, a coating liquid, a resin composition, and an adhesive composition.

Furthermore, according to the present invention, a liquid composition, a thermally conductive thin film, and a member for an electronic device each described below are provided.

[13] A liquid composition to be used for forming a thermally conductive thin film, the composition containing: a thermally conductive component containing the alumina-based thermally conductive oxide according to any one of [1] to [5]; a resin for forming a film; and a solvent.

[14] The liquid composition according to [13], wherein the thermally conductive component further contains at least one selected from the group consisting of barium sulfate, talc, and boron nitride.

[15] The liquid composition according to [13] or [14], wherein a content of the thermally conductive component is 20 to 200 parts by mass based on 100 parts by mass of the resin for forming a film.

[16] The liquid composition according to any one of [13] to [15], wherein the resin for forming a film is at least one solvent-soluble resin selected from the group consisting of an acrylic resin, a urethane-based resin, a urea-based resin, an epoxy-based resin, a rubber-based resin, a fluorine-based resin, a polyamide-based resin, a polyimide-based resin, a silicone-based resin, a cellulose-based resin, and a thermoplastic elastomer.

[17] A thermally conductive thin film formed by coating with the liquid composition according to any one of [13] to [16].

[18] A member for an electronic device, the member provided with: a member made of a metal; and the thermally conductive thin film according to [17] disposed on a surface of the member made of a metal.

Advantageous Effects of Invention

According to the present invention, an alumina-based thermally conductive oxide which has not only an excellent thermal conductivity but also excellent chemical resistance, water-fastness, and electrical insulation property, while exhibiting a satisfactory kneadability (miscibility) into a resin and being capable of producing materials and articles, such as a resin composition, having an excellent shapability; and a method for producing the alumina-based thermally conductive oxide can be provided. In addition, according to the present invention, a thermally conductive composition and an article each using the alumina-based thermally conductive oxide can be provided.

Further, according to the present invention, a liquid composition, a liquid composition capable of forming a thermally conductive thin film having excellent thermal conductivity, chemical resistance, and adhesiveness to various base materials and having a satisfactory handling property; a thermally conductive thin film formed using this liquid composition; and a member for an electronic device, the member provided with this thermally conductive thin film, can be provided.

DESCRIPTION OF EMBODIMENTS

<Alumina-Based Thermally Conductive Oxide>

Hereinafter, embodiments according to the present invention will be described, but the present invention is not limited to the following embodiments. An alumina-based thermally conductive oxide (hereinafter, simply referred to as "thermally conductive oxide") according to the present invention is obtained by firing a starting material mixture containing an aluminum starting material. In addition, the aluminum starting material is at least one selected from the group consisting of boehmite, aluminum hydroxide, and alumina, and the starting material mixture further contains: a boric acid compound; and at least one oxide starting material selected from the group consisting of a tungsten compound, a bismuth compound, a vanadium compound, a titanium compound, a frit, a phosphorus compound, a zinc compound, a cerium compound. In the starting material mixture, the content of the boric acid compound is 0.1 to 5 parts by mass, and the content of the oxide starting material is 0.1 to 20 parts by mass based on 100 parts by mass of the aluminum starting material. Hereinafter, the details of the thermally conductive oxide according to the present invention will be described.

A resin generally has a low thermal conductivity. Therefore, to improve the thermal conductivity of a resin article, a method of adding a large amount of a thermally conductive filler such as alumina to the resin is usually adopted. When the thermally conductive filler is blended in the resin and is dispersed in the resin so that the thermally conductive fillers have a contact point therebetween, the thermal conductivity peculiar to the thermally conductive filler is thereby exhibited. However, to exhibit a higher thermal conductivity, designing is performed so that a large amount of alumina is easily dispersed in a resin by using alumina having a larger particle diameter or using perfectly spherical alumina. However, when alumina thus designed is blended in a resin, the number of contact points between alumina and alumina decreases, so that the thermal conductivity is not improved so much in many cases. On the other hand, when alumina having a smaller particle diameter is added to a resin, the kneadability (miscibility) into the resin is deteriorated to make it difficult to disperse a large amount of alumina in the resin, thus making it difficult to improve the thermal conductivity.

The thermally conductive oxide according to the present invention is obtained by firing a starting material mixture containing: an aluminum starting material such as alumina; a boric acid compound; and an oxide starting material. The aluminum starting material and the other starting materials (boric acid compound and oxide starting material) are melt at the time of firing and produce the thermally conductive oxide by reacting part of the starting materials. That is, it can be considered that the other starting materials blended in small amounts function as a flux (mineralizing agent) and have an effect of bonding part of the aluminum starting materials and an effect of making the surface of the thermally conductive oxide smooth. Thereby, a thermally conductive oxide having a high wettability to a resin is obtained even though the number of contact points between the thermally conductive oxides is large, and therefore a material or an article having an improved thermal conductivity and an excellent shapability can be produced.

From this, there is no need to use an aluminum starting material having a large particle diameter or a perfect spherical shape. Further, when the amounts of the boric acid and the oxide starting material to be blended are appropriately adjusted, the filling property to a resin can be enhanced, and a thermally conductive oxide having a higher thermal conductivity as compared to alumina which is generally used as a thermally conductive filler can be made.

The thermally conductive oxide according to the present invention has an excellent thermal conductivity and has excellent chemical resistance, water-fastness, and electrical insulation property. Moreover, the thermally conductive oxide according to the present invention has a high wettability to a resin and a satisfactory kneadability (miscibility) into a resin, and therefore is capable of producing a material, such as a resin composition, and an article, such as a paint and an adhesive composition, each having an excellent shapability.

(Aluminum Starting Material)

The thermally conductive oxide according to the present invention is obtained by firing a starting material mixture containing an aluminum starting material and the other starting materials, and is preferably composed of α-alumina as a main component. The aluminum starting material is at least one selected from the group consisting of boehmite, aluminum hydroxide, and alumina.

Alumina finally turns into α-alumina (α-$Al_2O_3$) via intermediate alumina having a different crystal composition (α, γ, η, θ, χ, and κ) due to the difference in the starting material and the firing temperature. α-alumina is industrially produced by extracting an alumina component from bauxite as a starting material with an alkaline solution such as caustic soda, then forming aluminum hydroxide, and firing the aluminum hydroxide (Bayer method). Aluminum hydroxide obtained by the above-described method is usually gibbsite that is a trihydrate ($Al_2O_3 \cdot 3H_2O$). In general, aluminum hydroxide, such as: gibbsite; bayerite; and boehmite (inorganic compounds containing 90% or more of AlO(OH)) other than diaspore, and amorphous alumina hydrates, such as alumina gel, are dehydrated by firing to be finally α-alumina, which is most stable, via intermediate alumina, such as η-alumina, χ-alumina, γ-alumina, κ-alumina, and θ-alumina. It is also well known that this transition includes the transition series specific to the starting material, the firing condition, and the atmosphere.

As alumina, α-alumina, which is stable, and besides, γ-alumina and θ-alumina each being transition alumina are preferably used. Further, as the aluminum starting material, boehmite or aluminum hydroxide can be used. The shape and particle diameter of the aluminum starting material give an influence on the thermal conductivity and the kneadability into a resin of the resultant thermally conductive oxide. The shape of the aluminum starting material is preferably a particle having a number average particle diameter of 0.1 to 80 μm. Examples of more specific shapes of the aluminum starting material include a spherical shape and an amorphous shape.

(Other Starting Materials)

The other starting materials to be used together with the aluminum starting material contain a boric acid compound and an oxide starting material. In addition, the oxide starting material is at least one selected from the group consisting of a tungsten compound, a bismuth compound, a vanadium compound, a titanium compound, a frit, a phosphorus compound, a zinc compound, and a cerium compound. The other starting materials melt or react with the aluminum starting material at the time of firing, thereby bonding part of the particles of the aluminum starting material and forming a smooth layer on the surfaces of the particles. Thereby, the wettability of the resultant thermally conductive oxide to a resin is enhanced to improve the kneadability (miscibility) into the resin. The shape of the other starting materials which contain a frit or a phosphorus compound can be changed into a sheet-like shape, a rod-like shape, or other shapes. The other starting materials containing a zinc compound can lower the wearing property of a filler. Further, when at least one element selected from the group consisting of iron, cobalt, copper, manganese, nickel, chromium, and silicon is contained, a colored thermally conductive oxide can thereby be made.

Examples of the boric acid compound include boric acid, sodium borate, ammonium borate, magnesium borate, and lithium borate. Examples of the tungsten compound include ammonium tungstate and sodium tungstate. Examples of the bismuth compound include bismuth trioxide, bismuth subcarbonate, and bismuth hydroxide. Examples of the vanadium compound include vanadium oxide, vanadium nitride, and vanadium hydroxide. Examples of the titanium compound include titanium oxide. The frit is so-called multi-component glass and is composed of several types of elements. The melting point of the frit is preferably 400 to 800° C. The frit is preferably a non-colored grade frit in consideration of performing coloration later. In addition, it is preferable that the frit contain Si and further contain at least one element selected from the group consisting of Li, B, Na, K, Mg, Ca, Al, Zn, F, Ti, Zr, and P. When the frit having such a composition is used, an influence on the thermal conductivity of the resultant thermally conductive oxide is made small, and the wettability to a resin is further improved, so that the kneadability (miscibility) into a resin can be enhanced more. Further, it is preferable that the frit do not substantially contain Pb.

Examples of the phosphorus compound include tetraphosphorus hexaoxide, phosphoric acid, and sodium phosphate. Examples of the zinc compound include zinc oxide, zinc carbonate, and zinc hydroxide. Examples of the cerium compound include cerium oxide, cerium carbonate octahydrate, and cerium hydroxide.

Boric acid is a compound having a high water-solubility. However, boric acid has reactivity with the aluminum starting material, and therefore a composite oxide is formed by firing, so that the thermally conductive oxide having an excellent water-fastness can be obtained. For example, when the aluminum starting material and boric acid are fired, aluminum borate is formed. In addition, when the aluminum starting material and at least any one of the zinc compound and titanium oxide are fired, a composite oxide is partially formed in the aluminum starting material.

Further, when boric acid and a mixture of the frit and the aluminum starting material are fired, part of boric acid reacts with the aluminum starting material and with silica in the frit to form aluminum borate and borosilicate glass and melts. In this way, the boric acid compound and the other starting materials can be used in combination of two or more thereof.

As the oxide starting material, a metal oxide, hydroxide, oxoate, carbonate, or bicarbonate, or an ammonium salt producing an oxide by pyrolysis or phase transfer is preferably used. By using the component producing an oxide by pyrolysis or phase transfer as the oxide starting material, the particle diameter can be controlled; the reaction can be made uniform; and the surfaces of the particles can be made smooth.

The content of the boric acid compound in the starting material mixture is 0.1 to 5 parts by mass, preferably 0.1 to 4 parts by mass, more preferably 0.1 to 3 parts by mass, particularly preferably 0.3 to 1.5 parts by mass, and most preferably 0.3 to 1.0 part by mass based on 100 parts by mass of the aluminum starting material. If the content of the boric acid compound is less than 0.1 parts by mass based on 100 parts by mass of the aluminum starting material, the characteristics of the aluminum starting material are dominant, so that the effects of improving the thermal conductivity and the kneadability into a resin cannot be obtained. On the other hand, if the content of the boric acid compound exceeds 5 parts by mass based on 100 parts by mass of the aluminum starting material, an influence of the needle-like crystal of aluminum borate is large, so that the kneadability into a resin may be deteriorated.

In addition, the content of the oxide starting material in the starting material mixture is 0.1 to 20 parts by mass, preferably 0.1 to 10 parts by mass, more preferably 0.1 to 8 parts by mass, particularly preferably 0.3 to 5 parts by mass, and most preferably 0.5 to 5 part by mass based on 100 parts by mass of the aluminum starting material. If the content of the oxide starting material is less than 0.1 parts by mass based on 100 parts by mass of the aluminum starting material, the characteristics of the aluminum starting material are dominant, so that the effects of improving the thermal conductivity and the kneadability into a resin cannot be obtained. On the other hand, if the content of the oxide starting material exceeds 20 parts by mass based on 100 parts by mass of the aluminum starting material, the influence of the needle-like crystal of aluminum borate is large, the thermal conductivity of the resultant thermally conductive oxide is rather deteriorated.

When the frit is used as the oxide starting material, there is a tendency that a lump is likely produced after firing to make it difficult to obtain a product as a powder. By setting the amounts of the boric acid and the oxide starting materials based on 100 parts by mass of the aluminum starting material to the above-described ranges, a thermally conductive oxide in which various types of resistance of the aluminum starting material such as alumina are kept and which has excellent thermal conductivity, chemical resistance, water-fastness, and electrical insulation property, while exhibiting a satisfactory kneadability (miscibility) into a resin and being capable of producing a material and an article, such as a resin composition, having an excellent shapability can be obtained. The thermally conductive oxide according to the present invention has a more excellent thermal conductivity as compared to any of magnesium oxide, zinc oxide, and aluminum oxide. Further, the thermally conductive oxide according to the present invention has more excellent water-fastness and chemical resistance as compared to any of aluminum nitride, magnesium oxide, and zinc oxide.

(Surface Treatment)

Surface-treating the thermally conductive oxide according to the present invention is also preferable. In the surface-treated thermally conductive oxide, the affinity and dispersibility to a resin are improved, and therefore articles, such as a resin composition, having an excellent thermal conductivity, can be produced. Examples of the compound for use in the surface treatment (treatment agent) include a fatty acid, a fatty acid ester, a metal salt of a fatty acid, a phosphate ester, a metal salt of a phosphate ester, a silane coupling agent, a surfactant, a polymer coagulant, a titanate, and silicon. These treatment agents can be used singly or in combination of two or more thereof. The amount of the compound for use in the surface treatment is preferably set to 0.01 to 5 parts by mass based on 100 parts by mass of the thermally conductive oxide. Examples of the treatment method include: a method in which a treatment agent is put into a powder of the thermally conductive oxide, and a resultant mixture is treated by mixing; and a method in which a powder of the thermally conductive oxide after firing is put into water and is dispersed, further, a treatment agent is then put thereinto to perform filtration and drying.

(Use of Thermally Conductive Oxide)

Among preferred uses of the thermally conductive oxide according to the present invention, addition to various plastics such as a thermoplastic resin and a thermosetting resin for the purpose of imparting thermal conductivity is effective. Particularly, it is preferable to add the thermally conductive oxide according to the present invention to a thermoplastic resin because the degree of freedom of shapability by injection molding or the like is increased more than in the case where a conventional thermally conductive filler is used. As the thermoplastic resin, a polyethylene resin, a polypropylene resin, an ethylene-propylene copolymer, an ethylene-vinyl acetate copolymer, an acrylonitrile-ethylene-styrene copolymer, an acrylonitrile-butadiene-styrene copolymer, an acrylonitrile-styrene copolymer, a poly(vinyl chloride) resin, a polystyrene resin, a polyacrylonitrile resin, a polyamide resin, a thermoplastic polyimide resin, a thermoplastic urethane resin, a polyaminobismaleimide resin, a polyamideimide resin, a polyetherimide resin, a poly(methyl methacrylate) resin, a poly(vinyl acetate) resin, a polycarbonate resin, a polyacetal resin, a polyethylene terephthalate resin, a polybutylene terephthalate resin, a polyphenylene oxide resin, a polyphenylene sulfide resin, a polysulfone resin, a polyether sulfone resin, a polyether ether ketone resin, a polyallyl sulfone resin, a bismaleimide triazine resin, a polymethylpentene resin, a fluoride resin, a liquid crystal polymer, an olefin-vinyl alcohol copolymer, an ionomer resin, a polyarylate resin, or the like can be used. These thermoplastic resins can be used singly or in combination of two or more thereof.

<Method for Producing Alumina-Based Thermally Conductive Oxide>

Next, a method for producing the thermally conductive oxide according to the present invention will be described. The method for producing the thermally conductive oxide according to the present invention includes: a step of obtaining a starting material mixture by mixing an aluminum starting material, a boric acid compound, and an oxide starting material (step (1)); and a step of firing the obtained starting material mixture (step (2)). In the starting material mixture, the content of the boric acid compound is 0.1 to 5 parts by mass, and the content of the oxide starting material is 0.1 to 20 parts by mass each based on 100 parts by mass of the aluminum starting material mixture. Hereinafter, the details will be described.

In the step (1), the aluminum starting material, the boric acid compound, and the oxide starting material are mixed. As general methods of mixing the starting materials, there are a wet process and a dry process. However, the boric acid compound is water-soluble, and therefore when the above-described starting materials are mixed by the wet process, the boric acid compound may be likely to be lost in performing filtration. Therefore, the aluminum starting material, the boric acid compound, and the oxide starting material are preferably mixed by the dry process.

In the dry process, the components are mixed using a device, such as a pot mill, a Henschel mixer, an air mix, a conical blender, a planetary ball mill, a vibration mill, a ribbon mixer, and a vertical blender, and a resultant mixture is then fired. When the components are mixed, mixing may be performed so that the components can be uniform, and there is no need to pulverize particles of each component. Also, in the wet process, there is no need to pulverize particles of each component, and mixing may be performed so that the components can be uniform.

In the step (2), the starting material mixture obtained in the step (1) is fired at usually 600 to 1,500° C., and preferably at 1,100 to 1,500° C. By performing firing, the aluminum starting material can be turned into α-alumina in which the aluminum starting material has been crystallized. If the firing temperature is lower than 600° C., the α-alumina structure is hard to form. The thermal conductivity of transition alumina is lower than the thermal conductivity of α-alumina, and therefore α-alumina is preferably formed by firing. On the other hand, even if the firing temperature exceeds 1,500° C., there is a tendency that the properties of the resultant thermally conductive oxide does not change so much, resulting in useless energy consumption. The thermally conductive oxide can be obtained by pulverizing a fired product as necessary after firing.

<Thermally Conductive Composition>

A thermally conductive composition according to the present invention contains: the alumina-based thermally conductive oxide described above; and a thermally conductive filler. Hereinafter, the details thereof will be explained in detail.

General fillers are added to materials such as a resin, rubber, and a paint for the purpose of improving the strength and functionalities. When the amount of a thermally conductive filler blended is increased, the melt fluidity and mechanical strength of materials, such as a resin, are usually deteriorated. In addition, a carbon-based filler has electrical conductivity, and therefore there is a problem that when the carbon-based filler is blended into a resin, the insulation property which is the characteristic inherent in the resin is liable to be impaired. Further, a ceramic-based filler has an insulation property but has a problem such as a poor thermal conductivity. Examples of the thermally conductive filler include: metal-based fillers such as silver, copper, aluminum, and iron; inorganic fillers such as alumina, magnesia, silica, boron nitride, aluminum nitride, silicon carbide, boron carbide, and titanium carbide; and carbon-based fillers such as diamond and graphite. In electronic devices and the like where an enhanced electrical insulation property is demanded, fillers such as alumina, magnesium oxide, zinc oxide, silica, boron nitride, aluminum nitride, and diamond are regarded as preferable. However, these fillers have many problems in terms of water-fastness, chemical resistance, hardness, and electrical insulation property. In addition, in the case where coloring is performed by additional blend of a pigment or a dye, the colored product is liable to be whitened when scratched.

In contrast, the above weak points of the various fillers are improved in the thermally conductive oxide according to the present invention, so that the thermally conductive oxide according to the present invention has excellent properties and therefore can suitably be used as an improved filler. Further, the thermally conductive oxide according to the present invention is also preferably utilized with any of the above-described various thermally conductive fillers in order to compensate for the weak points of existing thermally conductive fillers. That is, the thermally conductive composition according to the present invention containing: the previously described thermally conductive oxide; and any of the above-described various fillers is a preferred aspect prepared according to the intended properties. In addition, the thermally conductive oxide according to the present invention can be colored by containing at least one element selected from the group consisting of iron, cobalt, copper, manganese, nickel, and chromium without adding a pigment or a dye, and therefore can prevent whitening.

<Article>

An article according to the present invention is an article (thermally conductive article or thermally conductive material), such as, for example, a gravure ink, a coating liquid, a resin composition, and an adhesive composition, the article containing the previously described thermally conductive oxide. It is to be noted that if necessary, any of the previously described various thermally conductive fillers is also preferably contained in the article according to the present invention.

(Gravure Ink)

The thermally conductive oxide according to the present invention can be used by addition to a gravure ink for use as a top coating agent for a battery packaging material. The content of the thermally conductive oxide in the gravure ink is preferably 5 to 80% by mass, and more preferably 10 to 50% by mass based on the total amount of the gravure ink. By the use of such a gravure ink (top coating agent for battery packaging material), a battery packaging material: having an excellent chemical resistance, such as acid resistance; having a high thermal conductivity; and having a high emissivity can be prepared.

(Coating Liquid)

The thermally conductive oxide according to the present invention can be used by addition to a coating liquid such as a paint. The coating liquid can also be made into a preparation for coloration, the preparation obtained by mixing and dispersing, for example, a colorant, a resin for forming a film or a shaped product, a solvent, and the like together with the thermally conductive oxide in a vehicle. The content of the thermally conductive oxide in the coating liquid is preferably 5 to 80% by mass, and more preferably 10 to 70% by mass based on the total amount of the coating liquid. A coating film or a coated-and-shaped product formed using the coating liquid thus prepared has excellent water-fastness, chemical resistance, and insulation property, has strength which will be retained, and has an excellent thermal conductivity. Further, when a thermally conductive thin film is formed on the surface of a member made of a metal, such as aluminum, copper, silver, gold, and stainless steel, using this coating liquid, the emissivity can thereby be improved without deteriorating the thermal conductivity of the metal itself.

Specific examples of the resin that can be contained in the coating liquid include: a polyolefin-based, polyester-based, polystyrene-based, acrylic, fluorine-based, polyamide-based, cellulose-based, polycarbonate-based, or polylactic acid-based thermoplastic resin; and a urethane-based or phenol-based thermosetting resin.

As a solvent that can be contained in the coating liquid, water or an organic solvent can be used. Specific examples of the organic solvent include methanol, ethanol, butanol, acetone, methyl ethyl ketone, methyl isobutyl ketone, toluene, xylene, butyl acetate, and cyclohexane.

An "additional component" can appropriately be selected and contained in the coating liquid according to the application in a range where the object of the present invention is not impaired. Examples of the "additional component" include an antioxidant, an ultraviolet absorber, a light stabilizer, a dispersant, an antistatic agent, a lubricant, and a fungicide.

Examples of the dispersant include: an anionic surfactant, such as a fatty acid or unsaturated fatty acid containing a polycarboxylic acid: a polymer type ionic surfactant; and a phosphate ester-based compound.

As a method of coating with the coating liquid, a conventionally known method can be adopted. Specific examples thereof include spray coating, brush coating, electrostatic coating, curtain coating, a method using a roll coater, and a method by immersion. In addition, also as a drying method for forming the coating liquid with which coating has been performed into a film, a conventionally known method can be adopted. Specifically, a method of natural drying, baking, or the like may appropriately be selected and adopted according to the characteristics of the coating liquid, and the like.

By the use of the coating liquid, a coating film obtained by coating a base material, or a coated-and-shaped product can be prepared. As the base material, a metal, glass, a natural resin, a synthetic resin, a ceramic, wood, paper, fiber, nonwoven fabric, woven fabric, or leather can be selected according to the application. It is to be noted that the coating film to which a functionality is imparted in this manner can be utilized in various types of industry such as industry, agriculture, mining, and fishing in addition to home use. Also, the coating shape is not particularly limited, a sheet-like shape, a film-like shape, a plate-like shape, or the like can be selected according to the application.

(Resin Composition)

A resin composition can be made by blending the thermally conductive oxide according to the present invention in a resin such as a polyamide resin or a polyolefin resin. More specifically, the resin composition can be obtained by blending and mixing the thermally conductive oxide together with an additional additive as necessary into a resin in accordance with a known method. Further, a predetermined resin-shaped product can be produced by supplying the obtained resin composition in an extrusion molding machine to perform shaping. The content of the thermally conductive oxide in the resin composition is preferably 5 to 95% by mass based on the total amount of the resin composition. By setting the content of the thermally conductive oxide to the above-described range, the resin composition having more excellent water-fastness, chemical resistance, and insulation property, having the strength which will be retained longer, and having a more excellent shapability can be made. If the content of the thermally conductive oxide exceeds 95% by mass, the strength and the shapability may be deteriorated. On the other hand, if the content of the thermally conductive oxide is less than 5% by mass, the thermal conductivity may be deficient.

The method of adding the thermally conductive oxide to the resin is not particularly limited, and a conventionally known method can be adopted. Examples thereof include: a method in which the thermally conductive oxide is directly blended in the resin to perform kneading and shaping; and besides, a method in which a composition (masterbatch) obtained by dispersing the thermally conductive oxide in a resin, a lubricant, or the like at a high concentration in advance is used. Examples of the additional additive include an antioxidant, an ultraviolet inhibitor, an antistatic agent, an antibacterial agent, a stabilizer, a crosslinking agent, a plasticizer, a lubricant, a release agent, a flame retardant, and inorganic fillers such as talc, alumina, clay, and silica. In addition, as a dispersion aid for the thermally conductive oxide, water, metal soap, polyethylene wax, or the like can also be used. Examples of the metal soap include lithium stearate, magnesium stearate, zinc stearate, calcium stearate, magnesium palmitate, calcium oleate, and cobalt oleate. As the polyethylene wax, for example, various types of polyethylene wax, such as a general polymerization type, a decomposition type, and a modified type, can be used.

It is to be noted that various organic pigments and inorganic pigments can also be blended as a colorant in the above-described coating liquid and resin composition. Examples of the colorant include: organic pigments such as phthalocyanine-based pigments, azo-based pigments, azomethine-based pigments, isoindolinone-based pigments, quinacridone-based pigments, anthraquinone-based pigments, dioxazine-based pigments, and perinone/perylene-based pigments; composite oxide-based pigments other than black; titanium oxide-based pigments such as titanium oxide-based white pigments, titanium oxide-based yellow pigments, titanium oxide-based black pigments; and inorganic pigments such as carbon black, ultramarine, and Bengala. It is to be noted that examples of the phthalocyanine-based pigments include brominated phthalocyanine blue pigments and phthalocyanine green pigments. In addition, examples of the azo-based pigments include polycondensation azo-based pigments and azomethine-azo-based pigments.

Further, the resin composition can also be obtained by melt-kneading, using an extrusion molding machine or the like, a masterbatch compound, in which the thermally conductive oxide, various types of piments, an additive, and the like are blended into a resin for a compound. More specifically, the resin composition can be obtained by the following steps: (i) blending the thermally conductive oxide and the dispersion aid in a resin for a compound, and, if necessary, adding an additional additive, and mixing the resultant mixture using a mixing machine such as a Henschel mixer; (ii) kneading the masterbatch compound using a kneader or a heating two-roll mill, and then pulverizing the kneaded product after cooling into the form of a coarse powder with a pulverizer; (iii) supplying the masterbatch compound into an extrusion molding machine to perform extrusion molding, thereby shaping the masterbatch compound into a bead-like shape, a columnar shape, or other shapes; and other steps. The shaping method is not particularly limited, and, for example, an injection molding method, an extrusion molding method, a heat-compression molding method, a blow molding method, an inflation molding method, a vacuum forming method, or the like may be adopted.

(Adhesive Composition)

The thermally conductive oxide according to the present invention can be used as an adhesive composition by addition to an adhesive. The type of a resin contained in the adhesive is not particularly limited as long as it is a resin having an adhesive property, such as a urethane-based, epoxy-based, vinyl acetate-based, or acrylic resin. In addition, the adhesion mechanism is not particularly limited, and may be any of a chemical reaction type, a solvent volatilization type, a hot-melt type, and a thermocompression type. The content of the thermally conductive oxide in the adhesive composition is preferably 5 to 80% by mass, and more preferably 10 to 50% by mass based on the total amount of the adhesive composition. By setting the content of the thermally conductive oxide to the above-described range, the adhesive composition having more excellent thermal conduction property, adhesion property, water-fastness, chemical resistance, and insulation property can be made. If the content of the thermally conductive oxide exceeds 80% by mass, the adhesion strength may be deficient. On the other hand, if the content of the thermally conductive oxide is less than 5% by mass, the thermal conductivity may be deficient.

When the thermally conductive oxide according to the present invention is made into the thermally conductive article or the thermally conductive material, such as a gravure ink, a coating liquid, a resin composition, and an adhesive composition as described above, and the thermally conductive article or the thermally conductive material is used, the thermally conductive oxide according to the present invention can thereby be used also as an electronic device having a heat dissipation property (thermal conductivity) and having excellent chemical resistance, waterfastness, and insulation property. More specifically, the thermally conductive oxide according to the present invention can be utilized for a metal circuit board, a circuit board, a metal laminate, an inner-layer circuit-containing metal-clad laminate, a battery packaging material, a sealing material, a protective sheet, and the like. Further, the thermally conductive oxide according to the present invention can be used as an adhesive sheet, a heat dissipation sheet, a heat dissipation coating agent, a semiconductor sealing agent, an adhesive, a heat dissipation spacer, grease, or the like.

<Liquid Composition>

A liquid composition according to the present invention is a liquid composition to be used for forming a thermally conductive thin film and contains: a thermally conductive component containing the alumina-based thermally conductive oxide described above; a resin for forming a film; and a solvent.

(Thermally Conductive Component)

The alumina-based thermally conductive oxide described above is contained in the thermally conductive component. In addition, the thermally conductive component preferably further contains at least one selected from the group consisting of barium sulfate, talc, and boron nitride. By using the component of barium sulfate or the like together with the alumina-based thermally conductive oxide, a thin film having a more excellent thermally conductivity can be formed.

The amount of the thermally conductive component in the liquid composition is preferably 20 to 200 parts by mass, and more preferably 50 to 150 parts by mass based on 100 parts by mass of the resin for forming a film. If the content of the thermally conductive component is less than 20 parts by mass, the thermal conductivity of the thin film to be formed may be deficient. On the other hand, if the content of the thermally conductive component exceeds 200 parts by mass, the content of the resin for forming a film increases relatively, and therefore there is a tendency that the film-forming property is deteriorated, and the adhesiveness of the thin film to be formed is deteriorated.

(Resin for Forming Film)

As the resin for forming a film, a resin that can form a film and is soluble to a solvent (solvent-soluble resin) can be used. As such a solvent-soluble resin, at least one selected from the group consisting of an acrylic resin, a urethane-based resin, a urea-based resin, an epoxy-based resin, a rubber-based resin, a fluorine-based resin, a polyamide-based resin, a polyimide-based resin, a cellulose-based resin, a silicone-based resin, and a thermoplastic elastomer can be used.

Examples of the acrylic resin include an acrylic silicone-based resin, an acrylic fluorine-based resin, poly(methyl methacrylate) (PMMA), poly(ethyl methacrylate), poly(m-ethyl acrylate), poly(ethyl acrylate), and poly(hydroxy methacrylate).

Examples of the urethane-based resin include: an ether-based, ester-based, carbonate-based, acrylic, or aliphatic urethane-based resin; and a resin obtained by subjecting a silicone-based polyol or a fluorine-based polyol to copolymerization with any of these urethane resins. It is to be noted that a urea bond or an imide bond may be contained in the molecular structure of the urethane-based resin, and a solvent may be any of water and an organic solvent.

The urea-based resin may be a resin having a urea bond in the molecular structure thereof, and examples thereof include a urethane urea elastomer, a melamine resin, and a urea formaldehyde resin.

Examples of the epoxy-based resin include a bisphenol A type epoxy resin, a novolak type epoxy resin, a brominated epoxy resin, a polyglycol type epoxy resin, a polyamide combination type epoxy resin, a silicone-modified epoxy resin, an amino resin combination type epoxy resin, and an alkyd resin combination type epoxy resin.

Examples of the rubber-based resin include natural rubber (NR), butadiene rubber (BR), acrylonitrile-butadiene rubber (NBR), hydrogenated NBR (H-NBR), styrene-butadiene rubber (SBR), isoprene rubber (IR), urethane rubber, chloroprene rubber (CR), epichlorohydrin rubber (ECO), an ethylene-propylene-diene polymer (EPDM), acrylic rubber (ACM), chlorosulfonated polyethylene (CSM), polysulfide rubber, and fluororubber.

Examples of the fluorine-based resin include poly(vinylidene fluoride) (PVDF), a vinylidene fluoride-tetrafluoroethylene copolymer, and a vinylidene fluoride-tetrafluoroethylene-hexafluoropropylene copolymer.

Examples of the polyamide-based resin include alcohol-soluble methoxymethylated nylon. Examples of the polyimide-based resin include polyamideimide (PAI), polyamic acid, and silicone imide.

Examples of the cellulose-based resin include: cellulose esters such as cellulose diacetate, cellulose triacetate, cellulose propionate, and cellulose acetate propionate; and cellulose ethers such as methyl cellulose, hydroxyethyl cellulose, hydroxypropyl cellulose, hydroxypropylmethyl cellulose, and carboxymethyl cellulose.

Examples of the silicone-based resin include methyl silicone, methylphenyl silicone, polyester resin-modified silicone, and silyl group-containing modified silicone.

Examples of the thermoplastic elastomer include: styrene-based thermoplastic elastomers such as a styrene-butadiene-styrene block copolymer (SBS), a styrene-isoprene-styrene block copolymer (SIS), a styrene-ethylene/butylene-styrene block copolymer (SEBS), and a styrene-ethylene/propylene-styrene block copolymer (SEPS); a urethane-based thermoplastic elastomer (TPU); an olefin-based thermoplastic elastomer (TPO); a polyester-based thermoplastic elastomer (TPEE); a polyamide-based thermoplastic elastomer; a fluorine-based thermoplastic elastomer; and a vinyl chloride-based thermoplastic elastomer.

(Solvent)

The solvent may be a general solvent for use in the coating agent for forming a thin film made of a resin. As the solvent, water or an organic solvent, such as an aromatic solvent, a hydrocarbon-based solvent, an alcohol-based solvent, a glycol derivative, a ketone-based solvent, a halogen-based solvent, an ester-based solvent, an ether-based solvent, and a nitrogen-containing solvent, can be used. These solvents can be used singly or in combination of two or more thereof.

Examples of the aromatic solvent include benzene, toluene, xylene, mesitylene, ethylbenzene, propylbenzene, butylbenzene, pentylbenzene, hexylbenzene, nonylbenzene, decylbenzene, undecylbenzene, dodecylbenzene, tetralin, and cyclohexylbenzene. Examples of the hydrocarbon-based solvent include straight-chain or branched-chain, saturated or unsaturated hydrocarbon-based solvents having 6 or more carbon atoms, such as hexane, heptane, octane, nonane, decane, and undecane.

Examples of the alcohol-based solvent include methanol, ethanol, propanol, isopropanol, butanol, isobutanol, hexanol, cyclohexanol, benzyl alcohol, ethylene glycol, propylene glycol, diethylene glycol, dipropylene glycol, polyethylene glycol, polypropylene glycol, triethylene glycol, tetraethylene glycol, tripropylene glycol, 1,2-butanediol, 1,3-butanediol, 1,4-butanediol, and 1,4-butenediol.

Examples of the glycol derivative include ethylene glycol monomethyl ether, ethylene glycol monoethyl ether, ethylene glycol monoisopropyl ether, ethylene glycol monobutyl ether, ethylene glycol monohexyl ether, ethylene glycol monophenyl ether, and ethylene glycol monomethyl ether acetate. Examples of the ketone-based solvent include acetone, methyl ethyl ketone, methyl isobutyl ketone, cyclohexanone, and methylcyclohexanone.

Examples of the halogen-based solvent include dichloromethane, dichloroethane, chloroform, carbon tetrachloride, tetrachloroethane, trichloroethane, chlorobenzene, dichlorobenzene, and chlorotoluene. Examples of the ester-based solvent include 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, methyl lactate, ethyl lactate, methyl acetate, ethyl acetate, propyl acetate, butyl acetate, amyl acetate, methyl propionate, ethyl propionate, methyl benzoate, ethyl benzoate, propyl benzoate, butyl benzoate, methyl butyrate, ethyl butyrate, and propyl butyrate.

Examples of the ether-based solvent include dibutyl ether, tetrahydrofuran, dioxane, anisole, and 3-phenoxytoluene. Examples of the nitrogen-containing solvent include N-methylformamide, N-ethylformamide, N,N-dimethylformamide, N,N-diethylformamide, acetamide, N-methylacetamide, N-ethylacetamide, N,N-dimethylacetamide, N,N-diethylacetamide, N-methylpyrrolidone, N-ethylpyrrolidone, N-propylpyrrolidone, N-vinylpyrrolidone, N,N'-dimethyl imidazolidinone, γ-butyrolactam, and ε-caprolactam.

The amount of the solvent in the liquid composition is not particularly limited and may appropriately be set according to the application. The amount of the solvent in the liquid composition is usually 1 to 90% by mass, and preferably 10 to 80% by mass.

In addition, a thin film having an excellent thermal conductivity can be formed by adding the urethane-based resin such as an aqueous polyurethane resin to the liquid composition and curing a resultant mixture. The thermally conductive thin film formed in this manner can be used as, for example, a heat dissipation sheet for an electronic device.

<Thermally Conductive Thin Film>

A thermally conductive thin film according to the present invention is formed by coating with the above-described liquid composition. As described previously, the thermally conductive component containing the alumina-based thermally conductive oxide is contained in the liquid composition. Therefore, the thermally conductive thin film according to the present invention formed using this liquid composition has excellent thermal conductivity and chemical resistance and also has an excellent adhesiveness to various base materials. It is to be noted that the thermally conductive thin film according to the present invention is usually formed by the thermally conductive component containing the alumina-based thermally conductive oxide, the thermally conductive component being dispersed in a thin resin layer formed by the resin for forming a film.

To form the thermally conductive thin film according to the present invention, for example, the liquid composition is applied on a desired base material, or the base material is impregnated with the liquid composition. Thereby, a coating film composed of the liquid composition can be formed on the surface of the base material. Thereafter, by drying the coating film, the thermally conductive thin film can be formed. As the method of applying the liquid composition (impregnation method), a general method, such as, for example, a printing method, a blade coating method, a (Meyer) bar coating method, a spray coating method, an immersion coating method, a bead coating method, an air knife coating method, a curtain coating method, and a roll coating method, can be adopted. Drying the coating film may be performed by any of air drying and drying by heating. The coating film, when dried by heating, can easily be dried to form the thermally conductive thin film. As the drying method, a general method, such as a method of placing the coating film in an oven, a method of allowing the coating film to pass through the inside of an oven, or a method of bringing the coating film into contact with a heating roller, can be adopted.

For example, by disposing the thermally conductive thin film according to the present invention on the surface of an electronic component or the like which is likely to generate heat, such as a lithium secondary battery, the generated heat can easily be dissipated outside by thermal radiation and thermal conduction. In addition, the thermally conductive thin film according to the present invention can easily be formed by applying and drying the liquid composition, or by other methods, and therefore is advantageous in terms of production costs. The thermally conductive thin film according to the present invention is particularly preferably disposed on the surface of an exterior material that constitutes a laminate type lithium secondary battery.

The exterior material that constitutes the laminate type lithium secondary battery (exterior material for lithium secondary battery) is formed by, for example, a heat-sealable sealant layer, aluminum foil, and a base material film such as a PET film, each laminated, if necessary, with an adhesive layer interposed therebetween. When the thermally conductive thin film according to the present invention is disposed on the surface of the base material film, the heat generated from the battery main body disposed on the side of the sealant layer can thereby be dissipated outside by thermal radiation and thermal conduction.

The thermally conductive thin film according to the present invention has an excellent adhesiveness to the surface of a metal, such as aluminum, copper, silver, gold, and stainless steel. In addition, by disposing the thermally conductive thin film on the surface of a member made of any of these metals so as to make a close contact with the surface, the emissivity can be improved without deteriorating the thermal conductivity of the metal itself. Therefore, the thermally conductive thin film according to the present invention, when disposed on the surface of a member made of a metal, such as aluminum, copper, silver, gold, and stainless steel, can be made into a member for an electronic device, such as a heat sink. It is to be noted that the thermally conductive thin film according to the present invention can easily be formed by coating the surface of the member made of a metal with the previously described liquid composition to thereafter perform drying and therefore is also advantageous in terms of production costs.

EXAMPLES

Hereinafter, the present invention will specifically be described based on Examples, but the present invention is not limited to these Examples. It is to be noted that "parts" and "%" in Examples and Comparative Examples are each on a mass basis unless otherwise noted.

<Aluminum Starting Material>

The aluminum starting materials described below were used.
- Aluminum hydroxide A: spherical, having a number average particle diameter of 6.5 m
- Aluminum hydroxide B: spherical, having a number average particle diameter of 10 μm
- Aluminum hydroxide C: spherical, having a number average particle diameter of 1.2 μm
- α-alumina: spherical, having a number average particle diameter of 20 μm
- Boehmite: spherical, having a number average particle diameter of 7 μm <Other Starting Materials>

Among the other starting materials, frits described below were used.
- Frit A: containing as main components Na, K, B, Si, Al, F, and P, having a softening point of 450° C.
- Frit B: containing as main components B, Si, Mg, and Al, having a softening point of 650° C.
- Frit C: containing as main components B, Si, Na, K, Ti, and F, having a softening point of 530° C.

<Production of Thermally Conductive Oxide>

Example 1

Into a small-sized mixer, 100 parts of aluminum hydroxide A, 0.1 parts of boric acid, and 0.1 parts of sodium tungstate were loaded, and a resultant mixture was stirred and mixed to obtain a starting material mixture. The obtained starting material mixture was fired in air at 1,250° C. for 3 hours, and a resultant product was then pulverized to obtain a powdered thermally conductive oxide.

Examples 2 to 162

Powdered thermally conductive oxides were each obtained in the same manner as in Example 1 previously described, except that the types and amounts of the aluminum starting materials, the boric acid compounds, and the other starting materials shown in Tables 1-1 to 1-7 were used.

Examples 163 to 174

Powdered thermally conductive oxides were each obtained in the same manner as in Example 1 previously described, except that the types and amounts of the aluminum starting materials, the boric acid compounds, the other starting materials, and the starting materials for coloration shown in Tables 1-7 to 1-8 were used.

Comparative Example 1

A powder obtained by firing aluminum hydroxide A in air at 1,200° C. for 2 hours was used as a sample of Comparative Example 1.

Comparative Example 4

A powder obtained by firing boehmite in air at 1,200° C. for 2 hours was used as a sample of Comparative Example 4.

Comparative Examples 2, 3, and 5 to 8

The substances described in Table 1-8 were each used as a sample of Comparative Example 2, 3, or 5 to 8)

Comparative Example 9

Into a small-sized mixer, 100 parts of aluminum hydroxide A and 50 parts of molybdenum oxide were loaded, and a resultant mixture was stirred and mixed to obtain a starting material mixture. The obtained starting material mixture was fired in air at 1,250° C. for 3 hours, and a resultant product was then pulverized to obtain a powder. The obtained powder was used as a sample of Comparative Example 9.

Comparative Example 10

Into a small-sized mixer, 100 parts of aluminum hydroxide A and 100 parts of molybdenum oxide were loaded, and a resultant mixture was stirred and mixed to obtain a starting material mixture. The obtained starting material mixture was fired in air at 1,250° C. for 3 hours, and a resultant product was then pulverized to obtain a powder. The obtained powder was used as a sample of Comparative Example 10.

TABLE 1-1

| | Aluminum starting material | | Boric acid compound | | Oxide starting material | |
|---|---|---|---|---|---|---|
| | Type | Amount (parts) | Type | Amount (parts) | Type | Amount (parts) |
| Example 1 | Aluminum hydroxide A | 100 | Boric acid | 0.1 | Sodium tungstate | 0.1 |
| Example 2 | Aluminum hydroxide A | 100 | Boric acid | 0.3 | Sodium tungstate | 0.5 |
| Example 3 | Aluminum hydroxide A | 100 | Boric acid | 0.5 | Sodium tungstate | 0.5 |
| Example 4 | Aluminum hydroxide A | 100 | Boric acid | 0.5 | Sodium tungstate | 1 |
| Example 5 | Aluminum hydroxide A | 100 | Boric acid | 1 | Sodium tungstate | 3 |
| Example 6 | Aluminum hydroxide A | 100 | Boric acid | 5 | Sodium tungstate | 20 |
| Example 7 | Aluminum hydroxide A | 100 | Boric acid | 0.1 | Bismuth oxide | 0.1 |
| Example 8 | Aluminum hydroxide A | 100 | Boric acid | 0.3 | Bismuth oxide | 0.5 |
| Example 9 | Aluminum hydroxide A | 100 | Boric acid | 0.5 | Bismuth oxide | 0.5 |
| Example 10 | Aluminum hydroxide A | 100 | Boric acid | 1 | Bismuth oxide | 3 |
| Example 11 | Aluminum hydroxide A | 100 | Boric acid | 3 | Bismuth oxide | 10 |
| Example 12 | Aluminum hydroxide A | 100 | Boric acid | 5 | Bismuth oxide | 20 |

TABLE 1-1-continued

|  | Aluminum starting material | | Boric acid compound | | Oxide starting material | |
|---|---|---|---|---|---|---|
|  | Type | Amount (parts) | Type | Amount (parts) | Type | Amount (parts) |
| Example 13 | Aluminum hydroxide A | 100 | Boric acid | 0.1 | Vanadium oxide | 0.1 |
| Example 14 | Aluminum hydroxide A | 100 | Boric acid | 0.3 | Vanadium oxide | 0.5 |
| Example 15 | Aluminum hydroxide A | 100 | Boric acid | 0.5 | Vanadium oxide | 0.5 |
| Example 16 | Aluminum hydroxide A | 100 | Boric acid | 1 | Vanadium oxide | 3 |
| Example 17 | Aluminum hydroxide A | 100 | Boric acid | 3 | Vanadium oxide | 10 |
| Example 18 | Aluminum hydroxide A | 100 | Boric acid | 5 | Vanadium oxide | 20 |
| Example 19 | Aluminum hydroxide A | 100 | Boric acid | 0.1 | Titanium oxide | 0.1 |
| Example 20 | Aluminum hydroxide A | 100 | Boric acid | 0.3 | Titanium oxide | 0.5 |
| Example 21 | Aluminum hydroxide A | 100 | Boric acid | 0.5 | Titanium oxide | 0.5 |
| Example 22 | Aluminum hydroxide A | 100 | Boric acid | 1 | Titanium oxide | 3 |
| Example 23 | Aluminum hydroxide A | 100 | Boric acid | 3 | Titanium oxide | 10 |
| Example 24 | Aluminum hydroxide A | 100 | Boric acid | 5 | Titanium oxide | 20 |
| Example 25 | Aluminum hydroxide A | 100 | Boric acid | 0.1 | Frit A | 0.1 |
| Example 26 | Aluminum hydroxide A | 100 | Boric acid | 0.3 | Frit A | 0.5 |
| Example 27 | Aluminum hydroxide A | 100 | Boric acid | 0.5 | Frit A | 0.5 |
| Example 28 | Aluminum hydroxide A | 100 | Boric acid | 1 | Frit A | 3 |
| Example 29 | Aluminum hydroxide A | 100 | Boric acid | 3 | Frit A | 10 |
| Example 30 | Aluminum hydroxide A | 100 | Boric acid | 5 | Frit A | 20 |
| Example 31 | Aluminum hydroxide A | 100 | Boric acid | 0.1 | Frit B | 0.1 |
| Example 32 | Aluminum hydroxide A | 100 | Boric acid | 0.3 | Frit B | 0.5 |
| Example 33 | Aluminum hydroxide A | 100 | Boric acid | 0.5 | Frit B | 0.5 |

TABLE 1-2

|  | Aluminum starting material | | Boric acid compound | | Oxide starting material | |
|---|---|---|---|---|---|---|
|  | Type | Amount (parts) | Type | Amount (parts) | Type | Amount (parts) |
| Example 34 | Aluminum hydroxide A | 100 | Boric acid | 1 | Frit B | 3 |
| Example 35 | Aluminum hydroxide A | 100 | Boric acid | 3 | Frit B | 10 |
| Example 36 | Aluminum hydroxide A | 100 | Boric acid | 5 | Frit B | 20 |
| Example 37 | Aluminum hydroxide A | 100 | Boric acid | 0.1 | Frit C | 0.1 |
| Example 38 | Aluminum hydroxide A | 100 | Boric acid | 0.3 | Frit C | 0.5 |
| Example 40 | Aluminum hydroxide A | 100 | Boric acid | 1 | Frit C | 3 |
| Example 41 | Aluminum hydroxide A | 100 | Boric acid | 3 | Frit C | 10 |
| Example 42 | Aluminum hydroxide A | 100 | Boric acid | 5 | Frit C | 20 |
| Example 43 | Aluminum hydroxide A | 100 | Boric acid | 0.1 | Lithium phosphate | 0.1 |
| Example 44 | Aluminum hydroxide A | 100 | Boric acid | 0.3 | Lithium phosphate | 0.5 |
| Example 45 | Aluminum hydroxide A | 100 | Boric acid | 0.5 | Lithium phosphate | 0.5 |
| Example 46 | Aluminum hydroxide A | 100 | Borice acid | 1 | Lithium phosphate | 3 |
| Example 47 | Aluminum hydroxide A | 100 | Borice acid | 3 | Lithium phosphate | 10 |
| Example 48 | Aluminum hydroxide A | 100 | Borice acid | 5 | Lithium phosphate | 20 |
| Example 49 | Aluminum hydroxide A | 100 | Borice acid | 0.1 | Trisodium phosphate | 0.1 |
| Example 50 | Aluminum hydroxide A | 100 | Borice acid | 0.3 | Trisodium phosphate | 0.5 |
| Example 51 | Aluminum hydroxide A | 100 | Borice acid | 0.5 | Trisodium phosphate | 0.5 |
| Example 52 | Aluminum hydroxide A | 100 | Borice acid | 1 | Trisodium phosphate | 3 |
| Example 53 | Aluminum hydroxide A | 100 | Borice acid | 3 | Trisodium phosphate | 10 |
| Example 54 | Aluminum hydroxide A | 100 | Borice acid | 5 | Trisodium phosphate | 20 |
| Example 55 | Aluminum hydroxide A | 100 | Borice acid | 0.1 | Zinc oxide | 0.1 |
| Example 57 | Aluminum hydroxide A | 100 | Borice acid | 0.5 | Zinc oxide | 0.5 |
| Example 58 | Aluminum hydroxide A | 100 | Borice acid | 1 | Zinc oxide | 3 |
| Example 59 | Aluminum hydroxide A | 100 | Borice acid | 3 | Zinc oxide | 10 |
| Example 60 | Aluminum hydroxide A | 100 | Boric acid | 5 | Zinc oxide | 20 |
| Example 61 | Aluminum hydroxide A | 100 | Boric acid | 0.1 | Cerium carbonate | 0.1 |
| Example 62 | Aluminum hydroxide A | 100 | Boric acid | 0.3 | Cerium carbonate | 0.5 |
| Example 63 | Aluminum hydroxide A | 100 | Boric acid | 0.5 | Cerium carbonate | 0.5 |
| Example 64 | Aluminum hydroxide A | 100 | Boric acid | 1 | Cerium carbonate | 3 |
| Example 65 | Aluminum hydroxide A | 100 | Boric acid | 3 | Cerium carbonate | 10 |
| Example 66 | Aluminum hydroxide A | 100 | Boric acid | 5 | Cerium carbonate | 20 |

TABLE 1-3

| | Aluminum starting material | | Boric acid compound | | Oxide starting material | |
|---|---|---|---|---|---|---|
| | Type | Amount (parts) | Type | Amount (parts) | Type | Amount (parts) |
| Example 67 | Aluminum hydroxide A | 100 | Lithium borate | 0.2 | Sodium tungstate | 0.5 |
| Example 68 | Aluminum hydroxide A | 100 | Lithium borate | 0.2 | Bismuth oxide | 0.5 |
| Example 69 | Aluminum hydroxide A | 100 | Lithium borate | 0.2 | Vanadium oxide | 0.5 |
| Example 70 | Aluminum hydroxide A | 100 | Lithium borate | 0.2 | Titanium oxide | 0.5 |
| Example 71 | Aluminum hydroxide A | 100 | Lithium borate | 0.2 | Frit A | 0.5 |
| Example 72 | Aluminum hydroxide A | 100 | Lithium borate | 0.2 | Frit B | 0.5 |
| Example 73 | Aluminum hydroxide A | 100 | Lithium borate | 0.2 | Frit C | 0.5 |
| Example 74 | Aluminum hydroxide A | 100 | Lithium borate | 0.2 | Lithium phosphate | 0.5 |
| Example 75 | Aluminum hydroxide A | 100 | Lithium borate | 0.2 | Trisodium phosphate | 0.5 |
| Example 76 | Aluminum hydroxide A | 100 | Lithium borate | 0.2 | Zinc oxide | 10 |
| Example 77 | Aluminum hydroxide A | 100 | Lithium borate | 0.2 | Cerium oxide | 0.5 |
| Example 78 | Aluminum hydroxide A | 100 | Sodium borate | 0.5 | Sodium tungstate | 0.5 |
| Example 79 | Aluminum hydroxide A | 100 | Sodium borate | 0.5 | Bismuth oxide | 0.5 |
| Example 80 | Aluminum hydroxide A | 100 | Sodium borate | 0.5 | Vanadium oxide | 0.5 |
| Example 81 | Aluminum hydroxide A | 100 | Sodium borate | 0.5 | Titanium oxide | 0.5 |
| Example 82 | Aluminum hydroxide A | 100 | Sodium borate | 0.5 | Frit A | 0.5 |
| Example 83 | Aluminum hydroxide A | 100 | Sodium borate | 0.5 | Frit B | 0.5 |
| Example 84 | Aluminum hydroxide A | 100 | Sodium borate | 0.5 | Frit C | 0.5 |
| Example 85 | Aluminum hydroxide A | 100 | Sodium borate | 0.5 | Lithium phosphate | 0.5 |
| Example 86 | Aluminum hydroxide A | 100 | Sodium borate | 0.5 | Trisodium phosphate | 0.5 |
| Example 87 | Aluminum hydroxide A | 100 | Sodium borate | 0.5 | Zinc oxide | 10 |
| Example 88 | Aluminum hydroxide A | 100 | Sodium borate | 0.5 | Cerium oxide | 0.5 |
| Example 89 | Aluminum hydroxide A | 100 | Magnesium borate | 0.5 | Sodium tungstate | 0.5 |
| Example 90 | Aluminum hydroxide A | 100 | Magnesium borate | 0.5 | Bismuth oxide | 0.5 |
| Example 91 | Aluminum hydroxide A | 100 | Magnesium borate | 0.5 | Vanadium oxide | 0.5 |
| Example 92 | Aluminum hydroxide A | 100 | Magnesium borate | 0.5 | Titanium oxide | 0.5 |
| Example 93 | Aluminum hydroxide A | 100 | Magnesium borate | 0.5 | Frit A | 0.5 |
| Example 94 | Aluminum hydroxide A | 100 | Magnesium borate | 0.5 | Frit B | 0.5 |
| Example 95 | Aluminum hydroxide A | 100 | Magnesium borate | 0.5 | Frit C | 0.5 |
| Example 96 | Aluminum hydroxide A | 100 | Magnesium borate | 0.5 | Lithium phosphate | 0.5 |
| Example 97 | Aluminum hydroxide A | 100 | Magnesium borate | 0.5 | Trisodium phosphate | 0.5 |
| Example 98 | Aluminum hydroxide A | 100 | Magnesium borate | 0.5 | Zinc oxide | 10 |
| Example 99 | Aluminum hydroxide A | 100 | Magnesium borate | 0.5 | Cerium oxide | 0.5 |

TABLE 1-4

| | Aluminum starting material | | Boric acid compound | | Oxide starting material | |
|---|---|---|---|---|---|---|
| | Type | Amount (parts) | Type | Amount (parts) | Type | Amount (parts) |
| Example 100 | Aluminum hydroxide B | 100 | Boric acid | 0.3 | Sodium tungstate | 0.5 |
| Example 101 | Aluminum hydroxide B | 100 | Boric acid | 0.5 | Sodium tungstate | 0.5 |
| Example 102 | Aluminum hydroxide B | 100 | Boric acid | 0.5 | Sodium tungstate | 1 |
| Example 103 | Aluminum hydroxide B | 100 | Boric acid | 1 | Sodium tungstate | 0.5 |
| Example 104 | Aluminum hydroxide B | 100 | Boric acid | 1 | Sodium tungstate | 1 |
| Example 105 | Aluminum hydroxide C | 100 | Boric acid | 0.2 | Titanium oxide | 0.5 |
| Example 106 | Aluminum hydroxide C | 100 | Boric acid | 0.2 | Titanium oxide | 0.6 |
| Example 107 | Aluminum hydroxide C | 100 | Boric acid | 0.5 | Sodium tungstate | 0.5 |
| Example 108 | Aluminum hydroxide C | 100 | Boric acid | 0.5 | Sodium tungstate | 1 |
| Example 109 | Aluminum hydroxide C | 100 | Boric acid | 1 | Sodium tungstate | 0.5 |
| Example 110 | Aluminum hydroxide C | 100 | Boric acid | 1 | Sodium tungstate | 1 |
| Example 111 | α-Alumina | 100 | Boric acid | 0.5 | Sodium tungstate | 0.5 |
| Example 112 | α-Alumina | 100 | Boric acid | 0.5 | Bismuth oxide | 0.5 |
| Example 113 | α-Alumina | 100 | Boric acid | 0.5 | Vanadium oxide | 0.5 |
| Example 114 | α-Alumina | 100 | Boric acid | 0.5 | Titanium oxide | 0.5 |
| Example 115 | α-Alumina | 100 | Boric acid | 0.5 | Frit A | 0.5 |
| Example 116 | α-Alumina | 100 | Boric acid | 0.5 | Frit B | 0.5 |
| Example 117 | α-Alumina | 100 | Boric acid | 0.5 | Frit C | 0.5 |
| Example 118 | α-Alumina | 100 | Boric acid | 0.5 | Lithium phosphate | 0.5 |
| Example 119 | α-Alumina | 100 | Boric acid | 0.5 | Trisodium phosphate | 0.5 |
| Example 120 | α-Alumina | 100 | Boric acid | 0.5 | Zinc oxide | 10 |
| Example 121 | α-Alumina | 100 | Boric acid | 0.5 | Cerium oxide | 0.5 |
| Example 122 | Boehmite | 100 | Boric acid | 0.5 | Sodium tungstate | 0.5 |
| Example 123 | Boehmite | 100 | Boric acid | 0.5 | Bismuth oxide | 0.5 |
| Example 124 | Boehmite | 100 | Boric acid | 0.5 | Vanadium oxide | 0.5 |
| Example 125 | Boehmite | 100 | Boric acid | 0.5 | Titanium oxide | 0.5 |
| Example 126 | Boehmite | 100 | Boric acid | 0.5 | Frit A | 0.5 |
| Example 127 | Boehmite | 100 | Boric acid | 0.5 | Frit B | 0.5 |
| Example 128 | Boehmite | 100 | Boric acid | 0.5 | Frit C | 0.5 |

TABLE 1-4-continued

|  | Aluminum starting material | | Boric acid compound | | Oxide starting material | |
|---|---|---|---|---|---|---|
|  | Type | Amount (parts) | Type | Amount (parts) | Type | Amount (parts) |
| Example 129 | Boehmite | 100 | Boric acid | 0.5 | Lithium phosphate | 0.5 |
| Example 130 | Boehmite | 100 | Boric acid | 0.5 | Trisodium phosphate | 0.5 |
| Example 131 | Boehmite | 100 | Boric acid | 0.5 | Zinc oxide | 10 |
| Example 132 | Boehmite | 100 | Boric acid | 0.5 | Cerium oxide | 0.5 |

TABLE 1-5

|  | Aluminum starting material | | Boric acid compound | | Oxide starting material | |
|---|---|---|---|---|---|---|
|  | Type | Amount (parts) | Type | Amount (parts) | Type | Amounts (parts) |
| Example 133 | Aluminum hydroxide A | 100 | Boric acid | 0.5 | Sodium tungstate<br>Bismuth oxide | 0.5<br>0.5 |
| Example 134 | Aluminum hydroxide A | 100 | Boric acid | 0.5 | Sodium tungstate<br>Vanadium oxide | 0.5<br>0.5 |
| Example 135 | Aluminum hydroxide A | 100 | Boric acid | 0.5 | Sodium tungstate<br>Titanium oxide | 0.5<br>0.5 |
| Example 136 | Aluminum hydroxide A | 100 | Boric acid | 0.5 | Sodium tungstate<br>Frit A | 0.5<br>0.5 |
| Example 137 | Aluminum hydroxide A | 100 | Boric acid | 0.5 | Sodium tungstate<br>Lithium phosphate | 0.5<br>0.2 |
| Example 138 | Aluminum hydroxide A | 100 | Boric acid | 0.5 | Sodium tungstate<br>Trisodium phosphate | 0.5<br>0.5 |
| Example 139 | Aluminum hydroxide A | 100 | Boric acid | 0.5 | Sodium tungstate<br>Zinc oxide | 0.5<br>10 |
| Example 140 | Aluminum hydroxide A | 100 | Boric acid | 0.5 | Sodium tungstate<br>Cerium oxide | 0.5<br>0.5 |
| Example 141 | Aluminum hydroxide A | 100 | Boric acid | 0.5 | Zinc oxide<br>Titanium oxide | 10<br>0.5 |
| Example 142 | Aluminum hydroxide A | 100 | Boric acid | 0.5 | Sodium tungstate<br>Titanium oxide | 0.5<br>0.5 |
| Example 143 | Aluminum hydroxide B | 100 | Boric acid | 0.5 | Sodium tungstate<br>Lithium phosphate | 0.5<br>0.2 |
| Example 144 | Aluminum hydroxide B | 100 | Boric acid | 0.5 | Sodium tungstate<br>Trisodium phosphate | 0.5<br>0.5 |
| Example 145 | Aluminum hydroxide B | 100 | Boric acid | 0.5 | Sodium tungstate<br>Zinc oxide | 0.5<br>10 |
| Example 146 | Aluminum hydroxide B | 100 | Boric acid | 0.5 | Sodium tungstate<br>Titanium oxide | 0.5<br>0.5 |
| Example 147 | Aluminum hydroxide C | 100 | Boric acid | 0.5 | Sodium tungastate<br>Sodium phosphate | 0.5<br>0.2 |
| Example 148 | Aluminum hydroxide C | 100 | Boric acid | 0.5 | Sodium tungstate<br>Trisodium phosphate | 0.5<br>0.5 |

TABLE 1-6

|  | Aluminum starting material | | Boric acid compound | | Oxide starting material | |
|---|---|---|---|---|---|---|
|  | Type | Amount (parts) | Type | Amount (parts) | Type | Amount (pars) |
| Example 149 | Aluminum hydroxide C | 100 | Boric acid | 0.5 | Sodium tungstate<br>Zinc oxide | 0.5<br>10 |
| Example 150 | Aluminum hydroxide C | 100 | Boric acid | 0.5 | Sodium tungstate<br>Titanium oxide | 0.5<br>0.5 |
| Example 151 | Aluminum hydroxide A | 100 | Boric acid | 0.5 | Sodium tungstate<br>Lithium phosphate<br>Zinc oxide | 0.5<br>0.2<br>10 |
| Example 152 | Aluminum hydroxide A | 100 | Boric acid | 0.5 | Sodium tungstate<br>Sodium phosphate<br>Zinc oxide | 0.5<br>0.5<br>10 |
| Example 153 | Aluminum hydroxide A | 100 | Boric acid | 0.5 | Titanium oxide<br>Bismuth oxide<br>Zinc oxide | 0.5<br>0.5<br>10 |
| Example 154 | Aluminum hydroxide A | 100 | Boric acid | 0.5 | Titanium oxide<br>Bismuth oxide<br>Sodium tungstate | 0.5<br>0.5<br>0.5 |

TABLE 1-6-continued

| | Aluminum starting material | | Boric acid compound | | Oxide starting material | |
|---|---|---|---|---|---|---|
| | Type | Amount (parts) | Type | Amount (parts) | Type | Amount (pars) |
| Example 155 | Aluminum hydroxide A | 100 | Boric acid | 0.5 | Frit C | 0.5 |
| | | | | | Sodium tungstate | 0.5 |
| | | | | | Sodium phosphate | 0.5 |
| Example 156 | Aluminum hydroxide A | 100 | Boric acid | 0.5 | Frit C | 0.5 |
| | | | | | Sodium tungstate | 0.5 |
| | | | | | Bismuth oxide | 0.5 |
| Example 157 | Aluminum hydroxide A | 100 | Boric acid | 0.5 | Frit C | 0.5 |
| | | | | | Sodium tungstate | 0.5 |
| | | | | | Zinc oxide | 10 |
| Example 158 | Aluminum hydroxide A | 100 | Boric acid | 0.5 | Sodium tungstate | 0.5 |
| | | | | | Zinc oxide | 10 |
| | | | | | Titanium oxide | 0.5 |
| Example 159 | Aluminum hydroxide C | 100 | Boric acid | 0.5 | Sodium tungstate | 0.5 |
| | | | | | Zinc oxide | 10 |
| | | | | | Titanium oxide | 0.5 |

TABLE 1-7

| | Aluminum starting material | | Boric acid compound | | Oxide starting material | | Starting material for coloration | |
|---|---|---|---|---|---|---|---|---|
| | Type | Amount (parts) | Type | Amount (parts) | Type | Amount (parts) | Type | Amount (parts) |
| Example 160 | Aluminum hydroxide C | 100 | Boric acid | 0.5 | Sodium tungstate | 0.5 | — | |
| | | | | | Zinc oxide | 10 | | |
| | | | | | Sodium phosphate | 0.5 | | |
| Example 161 | α-Alumina | 100 | Boric acid | 0.5 | Sodium tungstate | 0.5 | — | |
| | | | | | Zinc oxide | 10 | | |
| | | | | | Titanium oxide | 0.5 | | |
| Example 162 | Boehmite | 100 | Boric acid | 0.5 | Sodium tungstate | 0.5 | — | |
| | | | | | Zinc oxide | 10 | | |
| | | | | | Titanium oxide | 0.5 | | |
| Example 163 | Aluminum hydroxide A | 100 | Boric acid | 0.5 | Sodium tungstate | 0.5 | Basic copper carbonate | 20 |
| Example 164 | Aluminum hydroxide A | 100 | Boric acid | 0.5 | Sodium tungstate | 0.5 | Basic cobalt carbonate | 6.5 |
| Example 165 | Aluminum hydroxide A | 100 | Boric acid | 0.5 | Sodium tungstate | 0.5 | Hydrous iron oxide | 15 |
| Example 166 | Aluminum hydroxide A | 100 | Boric acid | 0.5 | Sodium tungstate | 0.5 | Manganese carbonate | 12 |
| Example 167 | Aluminum hydroxide A | 100 | Boric acid | 0.5 | Titanium oxide | 3 | Basic cobalt carbonate | 15 |
| Example 168 | Aluminum hydroxide A | 100 | Boric acid | 0.5 | Sodium tungstate | 0.5 | Nickel carbonate | 20 |
| Example 169 | Aluminum hydroxide A | 100 | Boric acid | 0.5 | Sodium tungstate | 0.5 | Chromium oxide | 20 |
| Example 170 | Aluminum hydroxide A | 100 | Boric acid | 0.5 | Sodium tungstate | 0.5 | Basic cobalt carbonate | 20 |
| | | | | | | | Hydrous iron oxide | 15 |
| | | | | | | | Manganese carbonate | 20 |
| Example 171 | Aluminum hydroxide A | 100 | Boric acid | 0.5 | Sodium tungstate | 0.5 | Basic copper carbonate | 10 |
| | | | | | | | Manganese carbonate | 2 |
| | | | | | | | Chromium oxide | 20 |
| Example 172 | Aluminum hydroxide A | 100 | Boric acid | 0.5 | Sodium tungstate | 0.5 | Basic copper carbonate | 19 |
| | | | | | | | Basic cobalt carbonate | 33 |
| | | | | | | | Manganese carbonate | 20 |

TABLE 1-8

| | Aluminum starting material | | Boric acid compound | | Oxide starting material | | Starting material for coloration | |
|---|---|---|---|---|---|---|---|---|
| | Type | Amount (parts) | Type | Amount (parts) | Type | Amount (parts) | Type | Amount (parts) |
| Example 173 | Aluminum hydroxide A | 100 | Boric acid | 0.5 | Sodium tungstate | 0.5 | Basic cobalt carbonate | 15 |
| | | | | | | | Silicon oxide | 5 |
| Example 174 | Aluminum hydroxide A | 100 | Boric acid | 0.5 | Sodium tungstate | 0.5 | Basic copper carbonate | 15 |
| | | | | | | | Manganese carbonate | 1 |
| Comparative Example 1 | Aluminum hydroxide A (1,200° C. × 2 hours fired product) | | | | | | | |
| Comparative Example 2 | α-Alumina (commercially available product, average particle diameter of 20 μm) | | | | | | | |
| Comparative Example 3 | α-Alumina (commercially available product, average particle diameter of 3 μm) | | | | | | | |

TABLE 1-8-continued

| | Aluminum starting material | | Boric acid compound | | Oxide starting material | | Starting material for coloration | |
|---|---|---|---|---|---|---|---|---|
| | Type | Amount (parts) | Type | Amount (parts) | Type | Amount (parts) | Type | Amount (parts) |
| Comparative Example 4 | | | | | Boehmite (1,200° C. × 2 hours fired product) | | | |
| Comparative Example 5 | | | | | Boron nitride (commercially available product, average particle diameter of 18 μm) | | | |
| Comparative Example 6 | | | | | Zinc oxide (commercially available product, average particle diameter of 20 μm) | | | |
| Comparative Example 7 | | | | | Magnesium oxide (commercially available product, average particle diameter of 20 μm) | | | |
| Comparative Example 8 | | | | | Aluminum nitride (commercially available product, average particle diameter of 19 μm) | | | |
| Comparative Example 9 | Aluminum hydroxide A | 100 | — | — | Molybdenum oxide | 50 | — | |
| Comparative Example 10 | Aluminum hydroxide A | 100 | — | — | Molybdenum oxide | 100 | — | |

<Evaluation 1>
(Preparation of Shaped Body A for Evaluation)

A resin composition obtained by mixing 50 parts of polypropylene (manufactured by Prime Polymer Co., Ltd., MFR of 20 g/10 min) and 50 parts of the thermally conductive oxide was placed in PLASTOMILL and melt-kneaded under a condition of a setting temperature of 200° C. Subsequently, a resultant product was press-molded with a metal mold under a condition of 175° C. to prepare a shaped body A for evaluation.

(Preparation of Shaped Body B for Evaluation)

A resin composition obtained by mixing 30 parts of polypropylene (manufactured by Prime Polymer Co., Ltd., MFR of 20 g/10 min) and 70 parts of the thermally conductive oxide was placed in PLASTOMILL to melt-kneaded under a condition of a setting temperature of 200° C. Subsequently, a resultant product was press-molded with a metal mold under a condition of 175° C. to prepare a shaped body B for evaluation.

(Chemical Resistance)

The shaped body B was cut out into a size of 40 mm×40 mm×1 mm in thickness to obtain a test piece. The obtained test piece was immersed in 5% hydrochloric acid, a 5% sulfuric acid aqueous solution, a 5% nitric acid aqueous solution, and a 5% sodium hydroxide aqueous solution in the mentioned order, and in each solution, the test piece was left to stand for one week except for stirring once every day. The mass of the test piece was measured before and after the immersion to calculate a change rate (%) of the mass based on the mass of the test piece before the immersion, and the chemical resistance was evaluated according to the evaluation criteria described below. The results are shown in Tables 2-1 to 2-6.

Good: the change rate of the mass is less than 2%
Poor: the change rate of the mass is 2% or more (Water-Fastness)

The shaped body B for evaluation was cut out into a size of 40 mm×40 mm×1 mm in thickness to obtain a test piece. The obtained test piece was left to stand in an atmosphere of a temperature of 70° C. and a relative humidity of 90% for 8 days, and after water adhered to the surface of the test piece was wiped out, the test piece was left to stand in an atmosphere of a temperature of 28° C. and a relative humidity of 50% for 3 hours. Further, the test piece was retained in an autoclave of 121° C., a pressure of 2 atmospheres, and a relative humidity of 100% for 120 hours. The withstand voltage of the test piece was measured before and after the treatment to calculate a lowering rate (%) of the withstand voltage based on the withstand voltage of the test piece before the treatment, and the water-fastness was evaluated according to the evaluation criteria described below. The results are shown in Tables 2-1 to 2-6.

Good: the lowering rate of the withstand voltage is less than 10%
Fair: the lowering rate of the withstand voltage is 10% or more and less than 50%
Poor: the lowering rate of the withstand voltage is 50% or more.

(Electrical Insulation Property)

After the thermally conductive oxide was filled in a ring made of aluminum, press molding (20 MPa) was performed with a hydraulic press to prepare a sample for measurement. The volume electrical resistance value of the prepared sample for measurement was measured using an electrical resistivity meter, and the electrical insulation property was evaluated according to the evaluation criteria described below. The results are shown in Tables 2-1 to 2-6.

Excellent: the volume electrical resistance value is $10^{10}$ Ω·cm or more
Good: the volume electrical resistance value is $10^5$ Ω·cm or more and less than $10^{10}$ Ω·cm
Fair: the volume electrical resistance value is 10 Ω·cm or more and less than $10^5$ Ω·cm
Poor: the volume electrical resistance value is less than 10 Ω·cm (Wettability)

A dispersion liquid was obtained by mixing 50 parts of a polyol (trade name "KURARAY POLYOL P-1010", manufactured by Kuraray Co., Ltd., viscosity (25° C.) of 1,500 kPa·s) and 50 parts of the thermally conductive oxide. The solution viscosity (25° C., number of revolution of 0.5 rpm) of the obtained dispersion liquid was measured using an E type rotational viscometer, and the wettability of the thermally conductive oxide to the resin was evaluated according to the evaluation criteria described below. The results are shown in Tables 2-1 to 2-6.

Excellent: the solution viscosity is 2,000 mPa·s or more and less than 5,000 mPa·s
Good: the solution viscosity is 5,000 mPa·s or more and less than 15,000 mPa·s
Fair: the solution viscosity is 15,000 mPa·s or more and less than 25,000 mPa·s
Poor: the solution viscosity is 25,000 mPa·s or more (Shapability)

The wear of the machine when the shaped body B for evaluation was prepared and the surface state of the shaped body B for evaluation, which was prepared, were observed, and the shapability was evaluated according to the evaluation criteria described below. The results are shown in Tables 2-1 to 2-6.

Good: there is no problem in particular in the wear and in the surface state.

Fair: there is a problem in either the wear or the surface state

Poor: there is a problem in the wear and in the surface state (Measurement of Mohs Hardness)

Smooth surfaces of minerals the Mohs hardness of which is known were rubbed together with the thermally conductive oxide disposed therebetween, and the Mohs hardness of the thermally conductive oxide was evaluated by observing the state of the smooth surfaces of the minerals. The results are shown in Tables 2-1 to 2-6.

(Measurement of Thermal Conductivity)

A resin composition obtained by mixing 30 parts of polypropylene (manufactured by Prime Polymer Co., Ltd., MFR of 20 g/10 min) was placed in PLASTOMILL and melt-kneaded under a condition of a setting temperature of 200° C. Subsequently, a resultant product was press-molded with a metal mold using a metal mold of 20 mm in length×20 mm in width×6 mm in height under a condition of 175° C. to prepare a test piece. The thermal conductivity of the prepared test piece was measured using a thermophysical property measurement apparatus (trade name "TPS-2500S", manufactured by Kyoto Electronics Manufacturing Co., Ltd.). The results are shown in Tables 2-1 to 2-6.

(Measurement of Dielectric Breakdown Voltage)

The shaped body B for evaluation was cut out into a size of 100 mm×100 mm×1 mm in thickness to obtain a test piece. The obtained test piece was immersed in oil to measure the dielectric break down voltage under a condition of an alternating current of 10 mA and a pressure increasing rate of 2 kV/sec in accordance with JIS K6911 and C2110-1. Values of the dielectric breakdown strength (kV/mm), each obtained by dividing the measured value of the dielectric breakdown voltage by the thickness (mm) of the test piece, are shown in Table 3.

TABLE 2-1

| | Chemical resistance | Water-fastness | Electrical insulation property | Wettability | Shapability | Mohs hardness | Thermal conductivity (W/m · K) |
|---|---|---|---|---|---|---|---|
| Example 1 | Good | Good | Good | Good | Good | 7 | 1.27 |
| Example 2 | Good | Good | Good | Good | Good | 6 | 1.13 |
| Example 3 | Good | Good | Excellent | Good | Good | 6 | 1.07 |
| Example 4 | Good | Good | Excellent | Good | Good | 6 | 1.06 |
| Example 5 | Good | Good | Excellent | Excellent | Good | 6 | 1.00 |
| Example 6 | Good | Good | Excellent | Excellent | Good | 6 | 0.95 |
| Example 7 | Good | Good | Good | Good | Good | 7 | 1.26 |
| Example 8 | Good | Good | Good | Good | Good | 6 | 1.10 |
| Example 9 | Good | Good | Excellent | Good | Good | 6 | 1.06 |
| Example 10 | Good | Good | Excellent | Good | Good | 6 | 1.02 |
| Example 11 | Good | Good | Excellent | Excellent | Good | 6 | 1.00 |
| Example 12 | Good | Good | Excellent | Excellent | Good | 6 | 0.94 |
| Example 13 | Good | Good | Good | Good | Good | 7 | 1.26 |
| Example 14 | Good | Good | Good | Good | Good | 6 | 1.11 |
| Example 15 | Good | Good | Excellent | Good | Good | 6 | 1.04 |
| Example 16 | Good | Good | Excellent | Good | Good | 6 | 1.01 |
| Example 17 | Good | Good | Excellent | Excellent | Good | 6 | 0.99 |
| Example 18 | Good | Good | Excellent | Excellent | Good | 6 | 0.93 |
| Example 19 | Good | Good | Good | Good | Good | 7 | 1.27 |
| Example 20 | Good | Good | Good | Good | Good | 6 | 1.10 |
| Example 21 | Good | Good | Excellent | Good | Good | 6 | 1.06 |
| Example 22 | Good | Good | Excellent | Good | Good | 6 | 1.01 |
| Example 23 | Good | Good | Excellent | Excellent | Good | 6 | 0.99 |
| Example 24 | Good | Good | Excellent | Excellent | Good | 6 | 0.96 |
| Example 25 | Good | Good | Good | Good | Good | 7 | 1.28 |
| Example 26 | Good | Good | Good | Good | Good | 6 | 1.18 |
| Example 27 | Good | Good | Excellent | Good | Good | 6 | 1.10 |
| Example 28 | Good | Good | Excellent | Good | Good | 6 | 1.00 |
| Example 29 | Good | Good | Excellent | Excellent | Good | 6 | 0.98 |
| Example 30 | Good | Good | Excellent | Excellent | Good | 6 | 0.94 |
| Example 31 | Good | Good | Good | Good | Good | 7 | 1.28 |
| Example 32 | Good | Good | Good | Good | Good | 6 | 1.18 |
| Example 33 | Good | Good | Excellent | Good | Good | 6 | 1.10 |
| Example 34 | Good | Good | Excellent | Good | Good | 6 | 1.00 |

TABLE 2-2

| | Chemical resistance | Water-fastness | Electrical insulation property | Wettability | Shapability | Mohs hardness | Thermal conductivity (W/m · K) |
|---|---|---|---|---|---|---|---|
| Example 35 | Good | Good | Excellent | Excellent | Good | 6 | 0.97 |
| Example 36 | Good | Good | Excellent | Excellent | Good | 6 | 0.93 |
| Example 37 | Good | Good | Good | Good | Good | 7 | 1.28 |
| Example 38 | Good | Good | Good | Good | Good | 6 | 1.14 |
| Example 39 | Good | Good | Good | Good | Good | 6 | 1.06 |
| Example 40 | Good | Good | Excellent | Good | Good | 6 | 1.02 |
| Example 41 | Good | Good | Excellent | Excellent | Good | 6 | 0.99 |

TABLE 2-2-continued

| | Chemical resistance | Water-fastness | Electrical insulation property | Wettability | Shapability | Mohs hardness | Thermal conductivity (W/m · K) |
|---|---|---|---|---|---|---|---|
| Example 42 | Good | Good | Excellent | Excellent | Good | 6 | 0.93 |
| Example 43 | Good | Good | Good | Good | Good | 7 | 1.30 |
| Example 44 | Good | Good | Good | Good | Good | 6 | 1.19 |
| Example 45 | Good | Good | Good | Good | Good | 6 | 1.08 |
| Example 46 | Good | Good | Excellent | Good | Good | 7 | 1.02 |
| Example 47 | Good | Good | Excellent | Good | Good | 7 | 1.00 |
| Example 48 | Good | Good | Excellent | Good | Good | 7 | 0.96 |
| Example 49 | Good | Good | Excellent | Good | Good | 7 | 1.29 |
| Example 50 | Good | Good | Good | Good | Good | 6 | 1.13 |
| Example 51 | Good | Good | Good | Good | Good | 6 | 1.07 |
| Example 52 | Good | Good | Excellent | Good | Good | 6 | 1.00 |
| Example 53 | Good | Good | Excellent | Good | Good | 6 | 0.97 |
| Example 54 | Good | Good | Good | Good | Good | 6 | 0.94 |
| Example 55 | Good | Good | Good | Good | Good | 6 | 1.25 |
| Example 56 | Good | Good | Good | Good | Good | 6 | 1.23 |
| Example 57 | Good | Good | Good | Good | Good | 6 | 1.20 |
| Example 58 | Good | Good | Good | Good | Good | 5 | 1.17 |
| Example 59 | Good | Good | Good | Good | Good | 5 | 1.08 |
| Example 60 | Good | Good | Good | Good | Good | 5 | 1.00 |
| Example 61 | Good | Good | Good | Good | Good | 7 | 1.27 |
| Example 62 | Good | Good | Good | Good | Good | 6 | 1.13 |
| Example 63 | Good | Good | Good | Good | Good | 6 | 1.05 |
| Example 64 | Good | Good | Excellent | Good | Good | 6 | 1.00 |
| Example 65 | Good | Good | Excellent | Good | Good | 6 | 0.98 |
| Example 66 | Good | Good | Excellent | Good | Good | 6 | 0.93 |
| Example 67 | Good | Good | Good | Good | Good | 6 | 1.07 |
| Example 68 | Good | Good | Good | Good | Good | 6 | 1.05 |

TABLE 2-3

| | Chemical resistance | Water-fastness | Electrical insulation property | Wettability | Shapability | Mohs hardness | Thermal conductivity (W/m · K) |
|---|---|---|---|---|---|---|---|
| Example 69 | Good | Good | Excellent | Excellent | Good | 6 | 1.06 |
| Example 70 | Good | Good | Excellent | Excellent | Good | 6 | 1.04 |
| Example 71 | Good | Good | Excellent | Good | Good | 6 | 1.05 |
| Example 72 | Good | Good | Excellent | Excellent | Good | 6 | 1.07 |
| Example 73 | Good | Good | Excellent | Excellent | Good | 6 | 1.06 |
| Example 74 | Good | Good | Excellent | Excellent | Good | 6 | 1.04 |
| Example 75 | Good | Good | Excellent | Good | Good | 6 | 1.05 |
| Example 76 | Good | Good | Excellent | Good | Good | 5 | 1.07 |
| Example 77 | Good | Good | Excellent | Good | Good | 6 | 1.08 |
| Example 78 | Good | Good | Good | Good | Good | 6 | 1.05 |
| Example 79 | Good | Good | Good | Good | Good | 6 | 1.04 |
| Example 80 | Good | Good | Good | Good | Good | 6 | 1.03 |
| Example 81 | Good | Good | Good | Good | Good | 6 | 1.07 |
| Example 82 | Good | Good | Good | Good | Good | 6 | 1.08 |
| Example 83 | Good | Good | Good | Good | Good | 6 | 1.06 |
| Example 84 | Good | Good | Good | Good | Good | 6 | 1.04 |
| Example 85 | Good | Good | Good | Good | Good | 6 | 1.02 |
| Example 86 | Good | Good | Good | Good | Good | 6 | 1.03 |
| Example 87 | Good | Good | Good | Good | Good | 5 | 1.07 |
| Example 88 | Good | Good | Good | Good | Good | 6 | 1.02 |
| Example 89 | Good | Good | Good | Good | Good | 6 | 1.05 |
| Example 90 | Good | Good | Good | Good | Good | 6 | 1.04 |
| Example 91 | Good | Good | Good | Good | Good | 6 | 1.06 |
| Example 92 | Good | Good | Excellent | Excellent | Good | 6 | 1.05 |
| Example 93 | Good | Good | Good | Good | Good | 6 | 1.05 |
| Example 94 | Good | Good | Good | Good | Good | 6 | 1.07 |
| Example 95 | Good | Good | Good | Good | Good | 6 | 1.02 |
| Example 96 | Good | Good | Good | Good | Good | 6 | 1.03 |
| Example 97 | Good | Good | Good | Good | Good | 6 | 1.04 |
| Example 98 | Good | Good | Good | Good | Good | 5 | 1.05 |
| Example 99 | Good | Good | Good | Good | Good | 6 | 1.07 |
| Example 100 | Good | Good | Good | Good | Good | 6 | 1.08 |
| Example 101 | Good | Good | Excellent | Excellent | Good | 6 | 1.06 |
| Example 102 | Good | Good | Excellent | Excellent | Good | 6 | 1.05 |

TABLE 2-4

|  | Chemical resistance | Water-fastness | Electrical insulation property | Wettability | Shapability | Mohs hardness | Thermal conductivity (W/m · K) |
|---|---|---|---|---|---|---|---|
| Example 103 | Good | Good | Good | Excellent | Good | 6 | 1.07 |
| Example 104 | Good | Good | Good | Excellent | Good | 6 | 1.05 |
| Example 105 | Good | Good | Excellent | Good | Good | 6 | 0.98 |
| Example 106 | Good | Good | Good | Excellent | Good | 6 | 1.00 |
| Example 107 | Good | Good | Good | Excellent | Good | 6 | 1.09 |
| Example 108 | Good | Good | Good | Excellent | Good | 6 | 1.08 |
| Example 109 | Good | Good | Excellent | Excellent | Good | 6 | 1.06 |
| Example 110 | Good | Good | Good | Good | Good | 6 | 1.03 |
| Example 111 | Good | Good | Good | Excellent | Good | 7 | 0.93 |
| Example 112 | Good | Good | Excellent | Excellent | Good | 7 | 0.94 |
| Example 113 | Good | Good | Good | Good | Good | 7 | 0.92 |
| Example 114 | Good | Good | Good | Excellent | Good | 7 | 0.95 |
| Example 115 | Good | Good | Good | Excellent | Good | 7 | 0.93 |
| Example 115 | Good | Good | Good | Expedient | Good | 7 | 0.94 |
| Example 117 | Good | Good | Good | Excellent | Good | 7 | 0.95 |
| Example 118 | Good | Good | Good | Excellent | Good | 7 | 0.93 |
| Example 119 | Good | Good | Good | Good | Good | 7 | 0.95 |
| Example 120 | Good | Good | Good | Good | Good | 6 | 0.93 |
| Example 121 | Good | Good | Good | Excellent | Good | 7 | 0.94 |
| Example 122 | Good | Good | Excellent | Excellent | Good | 6 | 1.05 |
| Example 123 | Good | Good | Good | Good | Good | 6 | 1.07 |
| Example 124 | Good | Good | Good | Good | Good | 6 | 1.03 |
| Example 125 | Good | Good | Good | Good | Good | 6 | 1.05 |
| Example 126 | Good | Good | Excellent | Good | Good | 6 | 1.06 |
| Example 127 | Good | Good | Good | Good | Good | 6 | 1.02 |
| Example 126 | Good | Good | Good | Good | Good | 6 | 1.07 |
| Example 129 | Good | Good | Good | Good | Good | 6 | 1.05 |
| Example 130 | Good | Good | Good | Good | Good | 6 | 1.03 |
| Example 131 | Good | Good | Good | Good | Good | 5 | 1.04 |
| Example 132 | Good | Good | Excellent | Good | Good | 6 | 1.02 |
| Example 133 | Good | Good | Good | Excellent | Good | 6 | 1.03 |
| Example 134 | Good | Good | Good | Excellent | Good | 6 | 1.04 |
| Example 135 | Good | Good | Good | Excellent | Good | 6 | 1.02 |
| Example 136 | Good | Good | Good | Excellent | Good | 6 | 1.05 |

TABLE 2-5

|  | Chemical resistance | Water-fastness | Electrical insulation property | Wettability | Shapability | Mohs hardness | Thermal conductivity (W/m · K) |
|---|---|---|---|---|---|---|---|
| Example 137 | Good | Good | Good | Excellent | Good | 6 | 1.02 |
| Example 138 | Good | Good | Excellent | Excellent | Good | 6 | 1.03 |
| Example 139 | Good | Good | Good | Good | Good | 5 | 1.04 |
| Example 140 | Good | Good | Excellent | Excellent | Good | 6 | 1.02 |
| Example 141 | Good | Good | Good | Excellent | Good | 5 | 1.04 |
| Example 142 | Good | Good | Good | Excellent | Good | 6 | 1.03 |
| Example 143 | Good | Good | Good | Good | Good | 6 | 1.05 |
| Example 144 | Good | Good | Excellent | Excellent | Good | 6 | 1.02 |
| Example 145 | Good | Good | Good | Good | Good | 5 | 1.03 |
| Example 146 | Good | Good | Good | Excellent | Good | 6 | 1.04 |
| Example 147 | Good | Good | Excellent | Expellent | Good | 6 | 1.05 |
| Example 148 | Good | Good | Good | Excellent | Good | 6 | 1.02 |
| Example 149 | Good | Good | Good | Excel ent | Good | 5 | 1.05 |
| Example 150 | Good | Good | Excellent | Excellent | Good | 6 | 1.03 |
| Example 151 | Good | Good | Good | Excellent | Good | 5 | 1.04 |
| Example 152 | Good | Good | Good | Excellent | Good | 5 | 1.03 |
| Example 153 | Good | Good | Good | Excellent | Good | 5 | 1.05 |
| Example 154 | Good | Good | Good | Excellent | Good | 6 | 1.02 |
| Example 155 | Good | Good | Good | Excellent | Good | 6 | 1.04 |
| Example 156 | Good | Good | Good | Excellent | Good | 6 | 1.07 |
| Example 157 | Good | Good | Good | Excellent | Good | 5 | 1.05 |
| Example 158 | Good | Good | Good | Excellent | Good | 5 | 1.03 |
| Example 159 | Good | Good | Good | Excellent | Good | 5 | 1.06 |
| Example 160 | Good | Good | Good | Good | Good | 5 | 1.04 |
| Example 161 | Good | Good | Good | Good | Good | 5 | 0.92 |
| Example 162 | Good | Good | Good | Excellent | Good | 5 | 1.01 |
| Example 163 | Good | Good | Good | Good | Good | 5 | 0.99 |
| Example 164 | Good | Good | Excellent | Excellent | Good | 5 | 0.95 |
| Example 165 | Good | Good | Good | Good | Good | 5 | 0.97 |
| Example 166 | Good | Good | Good | Excellent | Good | 5 | 0.94 |
| Example 167 | Good | Good | Good | Good | Good | 5 | 0.93 |

TABLE 2-5-continued

|  | Chemical resistance | Water-fastness | Electrical insulation property | Wettability | Shapability | Mohs hardness | Thermal conductivity (W/m · K) |
|---|---|---|---|---|---|---|---|
| Example 169 | Good | Good | Good | Excellent | Good | 5 | 0.96 |
| Example 169 | Good | Good | Excellent | Excellent | Good | 5 | 0.95 |
| Example 170 | Good | Good | Good | Excellent | Good | 5 | 0.97 |

TABLE 2-6

|  | Chemical resistance | Water-fastness | Electrical insulation property | Wettability | Shapability | Mohs hardness | Thermal conductivity (W/m · K) |
|---|---|---|---|---|---|---|---|
| Example 171 | Good | Good | Good | Good | Good | 5 | 0.93 |
| Example 132 | Good | Good | Good | Excellent | Good | 5 | 0.95 |
| Example 173 | Good | Good | Good | Excellent | Good | 5 | 0.92 |
| Example 174 | Good | Good | Good | Good | Good | 5 | 1.02 |
| Comparative Example 1 | Good | Good | Good | Fair | Fair | 9 | 1.37 |
| Comparative Example 2 | Good | Good | Good | Excellent | Fair | 9 | 0.86 |
| Comparative Example 3 | Good | Good | Good | Excellent | Fair | 9 | 0.80 |
| Comparative Example 4 | Good | Good | Good | Poor | Poor | 9 | 0.95 |
| Comparative Example 5 | Good | Good | Good | Poor | Fair | 2 | 2.66 |
| Comparative Example 6 | Poor | Poor | Fair | Excellent | Good | 5 | 0.95 |
| Comparative Example 7 | Poor | Poor | Good | Excellent | Good | 6 | 1.18 |
| Comparative Example 8 | Poor | Poor | Fair | Excellent | Fair | 8 | 1.41 |
| Comparative Example 9 | Good | Good | Good | Excellent | Fair | 6 | 0.79 |
| Comparative Example 10 | Good | Good | Good | Excellent | Fair | 6 | 0.68 |

TABLE 3

|  | Dielectric breakdown strength (kV/mm) |
|---|---|
| Comparative Example 3 | 30 |
| Example 9 | 32 |
| Example 38 | 31 |
| Example 69 | 35 |

<Preparation and Evaluation of Coating Liquid>

Coating liquids were each prepared by mixing 15 parts of one of the thermally conductive oxides of Example 105, Comparative Example 3, and Comparative Example 6, 62 parts of a urethane-based resin having a viscosity of 3,500 mPa·s, and 23 parts of ethyl acetate and dispersing a resultant mixture with a paint shaker. The prepared coating liquids were each applied on release paper uniformly using a glass rod, and the release paper was then placed in an oven of 100° C. for 2 minutes to volatilize the solvent component and form a coating film having a thickness of 50 μm. The thermal conductivity and emissivity of this coating film were measured to find that the coating film formed using α-alumina of Comparative Example 3 had a thermal conductivity of 0.28 W/mK and an emissivity of 0.88. In addition, the coating film formed using zinc oxide of Comparative Example 6 had a thermal conductivity of 0.18 W/mK and an emissivity of 0.88. In contrast, the coating film formed using the thermally conductive oxide of Example 105 had a thermal conductivity of 0.37 W/mK and an emissivity of 0.93. It can be considered that the reason that the thermal conductivity of the coating film formed using zinc oxide of Comparative Example 6 is very low is that the particle diameter of zinc oxide is large and therefore zinc oxide was scraped by the glass rod when the coating liquid was applied. As can be seen from those described above, the average particle diameter of the thermally conductive oxide for use in the coating liquid is preferably sufficiently small relative to the thickness of the coating film intended to be formed. In addition, the coating liquid prepared using the thermally conductive oxide of Example 105 was used as a topcoat for a battery exterior material by coating a nylon film for a battery exterior material therewith by means of a gravure coater. As a result, it was found that the temperature rise of the battery can be reduced by effective heat dissipation. It is to be noted that the method of measuring the emissivity is described below.

(Measurement of Emissivity)

A resin-shaped body having an area of 40 mm in length× 40 mm in width or larger and a thickness of 1 mm or less and having a smooth surface was prepared as a test piece. The emissivity of the prepared test piece was measured using an emissive meter (trade name "D and S AERD", manufactured by Kyoto Electronics Manufacturing Co., Ltd.).

<Preparation and Evaluation of Adhesive>

Dispersion liquids were each prepared by mixing 35 parts of one of the thermally conductive oxides of Example 105, Comparative Example 3, and Comparative Example 6 and 65 parts of a polyester polyol having a viscosity of 300 mPa·s and dispersing a resultant mixture using a paint shaker. A urethane resin-based chemical reaction type adhesive was obtained by mixing 98 parts of the prepared dispersion liquid and 2 parts of polyisocyanate having a viscosity of 2, 600 mPa·s and stirring a resultant mixture using a dissolver. Each of the obtained adhesives was applied on release paper uniformly using a glass rod, and the release paper was then placed in an oven of 100° C. for 2 minutes to volatilize the solvent component. Further, the release paper was placed in an oven of 40° C. for 96 hours to form a cured film of the adhesive. The thermal conductivity of this cured film was measured to find that the cured film formed using α-alumina of Comparative Example 3 had a thermal conductivity of 0.51 W/mK. In addition, the cured film formed using zinc oxide of Comparative Example 6 had a thermal conductivity of 0.56 W/mK. In contrast, it was found that the cured film formed using the thermally conductive oxide of Example 105 had a high thermal conductivity, as high as 0.67 W/mK.

<Production of Liquid Composition>

Examples 175 to 185 and Comparative Examples 11 to 20

Dispersion liquids were each obtained by mixing the types and amounts of the components shown in Table 4 and stirring a resultant mixture with a paint shaker (glass beads (diameter of 2 mm) were used). A liquid composition was obtained by adding 3 parts of a polyisocyanate resin (trade name "TAKENATE D-160N", manufactured by Mitsui Chemicals, Inc., resin content of 75%, solvent content of 25%) to 100 parts of each dispersion liquid obtained. It is to be noted that as the "resin for forming film" and the "solvent" in Table 4, the resin and the solvent described below were used. In addition, with respect to Comparative Examples 11 and 12, pulverization with a ball mill was performed in order to make the particle diameters uniform.

Resin for forming film: polyurethane resin (trade name "SANPRENE IB-1700D", manufactured by Sanyo Chemical Industries, Ltd., resin content of 30%, solvent content of 70%)

Solvent: Methyl ethyl ketone/toluene/isopropyl alcohol mixed solvent (Measurement of Thermal Conductivity (Thin Film))

The coating film for evaluation was cut into a size of 40 mm in length×40 mm in width to obtain a test piece. The thermal conductivity of the obtained test piece was measured with a "thin film measurement module" of a thermophysical property measurement apparatus (trade name "TPS-2500S", manufactured by Kyoto Electronics Manufacturing Co., Ltd.). The results are shown in Table 5.

(Measurement of Thermal Conductivity (Block))

A resin composition obtained by mixing 50 parts of polypropylene (manufactured by Prime Polymer Co., Ltd., MFR of 20 g/10 min) and thermally conductive components each in an amount of 50 parts was placed in PLASTOMILL and melt-kneaded under a condition of a setting temperature of 200° C. Subsequently, a resultant product was press-molded with a metal mold using a metal mold of 20 mm in length×20 mm in width×6 mm in height under a condition of 175° C. to prepare a test piece. The thermal conductivity of the obtained test piece was measured with a "standard isotropy measurement module" of a thermophysical property measurement apparatus (trade name "TPS-2500S", manufactured by Kyoto Electronics Manufacturing Co., Ltd.). The results are shown in Table 5.

(Wettability)

A dispersion liquid was obtained by mixing 50 parts of a polyol (trade name "KURARAY POLYOL P-1010", manufactured by Kuraray Co., Ltd., viscosity (25° C.) of 1,500 kPa·s) and 50 parts of the thermally conductive oxide. The

TABLE 4

| | Thermally conductive components | | | | Number average particle diameter (µm) | Resin for forming film (parts) | Solvent | |
|---|---|---|---|---|---|---|---|---|
| | Thermally conductive oxide | | Others | | | | | |
| | Type | Amount (parts) | Type | Amount (parts) | | | resin-dissolved (parts) | added (parts) |
| Example 175 | Example 20 | 20 | — | — | 4.8 | 19 | 44 | 17 |
| Example 176 | Example 44 | 20 | — | — | 1.1 | 19 | 44 | 17 |
| Example 177 | Example 70 | 20 | — | — | 3.8 | 19 | 44 | 17 |
| Example 178 | Example 105 | 20 | — | — | 1.2 | 19 | 44 | 17 |
| Example 179 | Example 106 | 20 | — | — | 1.2 | 19 | 44 | 17 |
| Example 180 | Example 142 | 20 | — | — | 1.2 | 19 | 44 | 17 |
| Example 181 | Example 150 | 20 | — | — | 1.2 | 19 | 44 | 17 |
| Example 182 | Example 170 | 20 | — | — | 1.2 | 19 | 44 | 17 |
| Example 183 | Example 105 | 10 | Barium sulfate | 10 | — | 19 | 44 | 17 |
| Example 184 | Example 105 | 10 | Talc | 10 | — | 19 | 44 | 17 |
| Example 185 | Example 105 | 10 | Boron nitride | 10 | — | 19 | 44 | 17 |
| Comparative Example 11 | Comparative Example 9 | — | — | 20 | 3.8 | 19 | 44 | 17 |
| Comparative Example 12 | Comparative Example 10 | — | — | 20 | 5.0 | 19 | 44 | 17 |
| Comparative Example 13 | — | — | Barium sulfate | 20 | 0.9 | 19 | 44 | 17 |
| Comparative Example 14 | — | — | Aluminum hydroxide C | 20 | 1.2 | 19 | 44 | 17 |
| Comparative Example 15 | — | — | α-alumina | 20 | 3.1 | 19 | 44 | 17 |
| Comparative Example 16 | — | — | Talc | 20 | 4.3 | 19 | 44 | 17 |
| Comparative Example 17 | — | — | Magnesium oxide | 20 | 3.0 | 19 | 44 | 17 |
| Comparative Example 18 | — | — | Zinc oxide | 20 | 2.0 | 19 | 44 | 17 |
| Comparative Example 19 | — | — | Aluminum nitride | 20 | 2.0 | 19 | 44 | 17 |
| Comparative Example 20 | — | — | Boron nitride | 20 | 4.0 | 19 | 44 | 17 |

<Evaluation (2)>

(Formation of Coating Film for Evaluation)

Each liquid composition was applied on release paper using a multi coater (trade name "K-303", manufactured by RK Print Coat Instruments Ltd.), and the solvent was then removed by hot air drying. Subsequently, a coating film having a concentration of the thermally conductive component (filler) of 48% and a film thickness of about 100 µm was formed by aging in an oven of 40° C. for 48 hours.

solution viscosity (250, number of revolution of 0.5 rpm) of the obtained dispersion liquid was measured using an E type rotational viscometer, and the wettability of the thermally conductive oxide to the resin was evaluated according to the evaluation criteria described below. The results are shown in Table 5.

Excellent: the solution viscosity is 2,000 mPa·s or more and less than 5,000 mPa·s Good: the solution viscosity is 5,000 mPa·s or more and less than 15,000 mPa·s Fair: the solution viscosity is 15,000 mPa·s or more and less than 25,000 mPa·s Poor: the solution viscosity is 25,000 mPa·s or more (Chemical Resistance)

The coating film for evaluation was cut out into a size of 40 mm in length×40 mm in width×100 μm in thickness to obtain a test piece. The obtained test piece was immersed in 5% hydrochloric acid, a 5% sulfuric acid aqueous solution, a 5% nitric acid aqueous solution, and a 5% sodium hydroxide aqueous solution in the mentioned order, and in each solution, the test piece was left to stand for one week except for stirring once every day. The mass of the test piece was measured before and after the immersion to calculate a change rate (%) of the mass based on the mass of the test piece before the immersion, and the chemical resistance was evaluated according to the evaluation criteria described below. The results are shown in Table 5.

Good: the change rate of the mass is less than 5%

Fair: the change rate of the mass is 5% or more and less than 20%

Poor: the change rate of the mass is 20% or more (Measurement of Emissivity)

The coating film for evaluation was cut out into a size of 40 mm in length×40 mm in width to obtain a test piece. The emissivity of the obtained test piece was measured using an emissive meter (trade name "D and S AERD", manufactured by Kyoto Electronics Manufacturing Co., Ltd.). The results are shown in Table 5.

(Adhesiveness)

Corona-treated surfaces (treated PET and treated NY) and corona-untreated surfaces (untreated PET and untreated NY) of a biaxially oriented polyester film (trade name "Ester Film E-5102", manufactured by TOYOBO CO., LTD.) and a biaxially oriented nylon film (trade name "HARDEN Film N-1102", manufactured by TOYOBO CO., LTD.) were coated with the liquid composition using a bar coater #5. After the solvent was removed by hot air drying, and aging was performed in an oven of 40° C. for 48 hours to prepare a test piece having a thin film formed on the surfaces of each film. The operation in which a cellophane tape ("trade name "CELLOTAPE (R)", manufactured by Nichiban Co., Ltd., 24 mm in width) was adhered to a thin film surface of the test piece and was then peeled in a vertical direction was repeated three times at the same point, and thereafter the state of the thin film was checked to evaluate the adhesiveness according to the evaluation criteria described below. The results are shown in Table 5.

Good: the thin film is not peeled

Fair: the thin film is peeled in some parts

Poor: the thin film is peeled for the most part

TABLE 5

| | Thermal conductivity (W/m·K) | | | Chemical resistance | | Emissivity | Adhesiveness | | | |
|---|---|---|---|---|---|---|---|---|---|---|
| | Thin film | Block | Wettability | Acid | Alkali | (—) | Treated PET | Untreated PET | Treated NY | Untreated NY |
| Example 175 | 0.53 | 0.68 | Good | Good | Good | 0.93 | Good | Good | Good | Good |
| Example 176 | 0.59 | 0.70 | Good | Good | Good | 0.92 | Good | Good | Good | Good |
| Example 177 | 0.48 | 0.58 | Excellent | Good | Good | 0.91 | Good | Good | Good | Good |
| Example 178 | 0.46 | 0.56 | Good | Good | Good | 0.91 | Good | Good | Good | Good |
| Example 179 | 0.47 | 0.58 | Good | Good | Good | 0.92 | Good | Good | Good | Good |
| Example 180 | 0.49 | 0.59 | Good | Good | Good | 0.92 | Good | Good | Good | Good |
| Example 181 | 0.51 | 0.60 | Good | Good | Good | 0.92 | Good | Good | Good | Good |
| Example 182 | 0.51 | 0.61 | Good | Good | Good | 0.92 | Good | Good | Good | Good |
| Example 183 | 0.41 | 0.52 | Good | Good | Good | 0.92 | Good | Good | Good | Good |
| Example 184 | 0.45 | 0.58 | Good | Good | Good | 0.92 | Good | Good | Good | Good |
| Example 185 | 0.65 | 0.80 | Fair | Good | Fair | 0.91 | Good | Good | Good | Good |
| Comparatative Example 11 | 0.29 | 0.43 | Excellent | Good | Good | 0.91 | Good | Good | Good | Good |
| Comparatative Example 12 | 0.27 | 0.38 | Excellent | Good | Good | 0.90 | Good | Good | Good | Good |
| Comparatative Example 13 | 0.22 | 0.33 | Good | Good | Good | 0.91 | Good | Good | Good | Good |
| Comparatative Example 14 | 0.40 | 0.58 | Good | Poor | Poor | 0.91 | Good | Good | Good | Good |
| Comparatative Example 15 | 0.31 | 0.45 | Excellent | Good | Good | 0.92 | Good | Good | Good | Good |
| Comparatative Example 16 | 0.36 | 0.61 | Poor | Good | Poor | 0.91 | Fair | Fair | Fair | Fair |
| Comparatative Example 17 | 0.33 | 0.51 | Excellent | Poor | Good | 0.90 | Good | Good | Good | Good |
| Comparatative Example 18 | 0.39 | 0.50 | Excellent | Poor | Good | 0.91 | Good | Good | Good | Good |
| Comparatative Example 19 | 0.54 | 0.70 | Good | Good | Poor | 0.89 | Good | Good | Good | Good |
| Comparetative Example 20 | 0.69 | 0.90 | Poor | Good | Poor | 0.87 | Good | Good | Good | Good |

Example 186

The surface of a member made of aluminum was coated with the liquid composition of Example 177. After the solvent was removed by hot air drying, aging was performed in an oven of 40° C. for 48 hours to prepare a test piece having a thin film formed on the surface of the member. The thermal conductivity of the prepared test piece was measured in the same manner as in the previously described "Measurement of Thermal Conductivity (Thin Film)" in "Evaluation (2)". As a result, it was made clear that the value of the thermal conductivity of the test piece is sufficiently high without inhibiting the thermal conductivity of aluminum. In addition, it was made clear that the emissivity of the test piece, measured in the same manner as in the previously described "Measurement of Emissivity" in "Evaluation (2)", is 0.50 and is improved from the emissivity (0.03) of aluminum itself. Further, the formed thin film had a high adhesiveness to the surface of the member made of aluminum.

Example 187

A liquid composition was prepared by blending 20 parts of the thermally conductive oxide of Example 105, 61 parts of water, and 19 parts of an aqueous urethane resin as a resin for forming a film. After the surface of the member made of aluminum was coated with the prepared liquid composition, the solvent was removed by hot air drying. Subsequently, aging was performed in an oven of 40° C. for 48 hours to prepare a test piece having a thin film on the surface of the member. The thermal conductivity of the prepared test piece was measured in the same manner as in the previously described "Measurement of Thermal Conductivity (Thin Film)" in "Evaluation (2)". As a result, it was made clear that the thermal conductivity of the test piece is sufficiently high without inhibiting the thermal conductivity of aluminum. In addition, it was made clear that the emissivity of the test piece, measured in the same manner as in the previously described "Measurement of Emissivity" in "Evaluation (2)" is higher than the emissivity (0.03) of aluminum itself. Further, the formed thin film had a high adhesiveness to the surface of the member made of aluminum.

The invention claimed is:

1. An alumina-based thermally conductive oxide comprising a fired and pulverized product of a starting material mixture,
    wherein the starting material mixture comprises:
        an aluminum starting material, the aluminum starting material comprising:
            at least one material selected from the group consisting of boehmite, aluminum hydroxide, and alumina, wherein a shape of the aluminum starting material is a particle having a number average particle diameter in a range from 0.1 to 80 µm; and
        an additional starting material, wherein the additional starting material consists of:
            a boric acid compound; and
            an oxide starting material,
    wherein the oxide starting material in the additional starting material is
        (a) at least one compound selected from the group consisting of a tungsten compound, a bismuth compound, a titanium compound, a phosphorus compound, a zinc compound, and a cerium compound, or
        (b) a frit, or a mixture of the frit and the at least one compound (a),
    wherein the at least one compound (a) of the oxide starting material is in at least one form selected from the group consisting of a metal oxide, a hydroxide, an oxoate, a carbonate, a bicarbonate, and an ammonium salt, or is at least one salt compound selected from the group consisting of sodium tungsten and sodium phosphate, or a combination of the at least one salt compound with the at least one compound (a) in the at least one form,
    in the starting material mixture, a content of the boric acid compound is in a range from 0.1 to 5 parts by mass, and a content of the oxide starting material is in a range from 0.1 to 20 parts by mass, each based on 100 parts by mass of the aluminum starting material,
    if the oxide starting material is the frit or one of the mixtures that contain the frit, the frit is a non-colored grade frit that does not contain Pb and the non-colored grade frit consists of: Si; and at least one element selected from the group consisting of Li, B, Na, K, Mg, Ca, Al, Zn, F, Ti, Zr, and P,
    in the alumina-based thermally conductive oxide, a fired product of the particles of the aluminum starting material bound to each other by the additional starting material are present, and
    the additional starting material smoothens a surface of the alumina-based thermally conductive oxide, when being fired.

2. The alumina-based thermally conductive oxide according to claim 1,
    wherein the alumina-based thermally conductive oxide has a surface treatment with a surface treatment agent in an amount from 0.01 part by mass to 5 part by mass based on the alumina-based thermally conductive oxide as 100 parts by mass, and
    the surface treatment agent is at least one material selected from the group consisting of a fatty acid, a fatty acid ester, a metal salt of a fatty acid, a phosphate ester, a metal salt of a phosphate ester, a silane coupling agent, a surfactant, a polymer coagulant, a titanate, and silicon.

3. A method for producing the alumina-based thermally conductive oxide according to claim 1, the method comprising:
    mixing the aluminum starting material with the additional starting material, so as to form a starting material mixture; and
    firing the resulting starting material mixture.

4. The method for producing the alumina-based thermally conductive oxide according to claim 3, wherein the starting material mixture is fired in air at a temperature in a range from 600 to 1,500° C.

5. The method for producing the alumina-based thermally conductive oxide according to claim 3,
    wherein in the mixing for forming the starting material mixture, the aluminum starting material and the additional starting material are mixed by a dry process.

6. A thermally conductive composition comprising:
    the alumina-based thermally conductive oxide according to claim 1; and
    a thermally conductive filler.

7. The thermally conductive composition according to claim 6,
    wherein the thermally conductive filler is a filler of at least one material selected from the group consisting of silver, copper, aluminum, iron, alumina, magnesia, silica, boron nitride, aluminum nitride, silicon carbide, boron carbide, titanium carbide, diamond, and graphite.

8. An article comprising the alumina-based thermally conductive oxide according to claim 1.

9. The article according to claim 8, further comprising a thermally conductive filler.

10. The article according to claim 8,
    wherein the article is at least one material selected from the group consisting of a gravure ink, a coating liquid, a resin composition, and an adhesive composition.

11. A liquid composition to be used for forming a thermally conductive thin film, the composition comprising:
    a thermally conductive component comprising the alumina-based thermally conductive oxide according to claim 1;
    a resin for forming a film; and
    a solvent.

12. The liquid composition according to claim 11,
    wherein the thermally conductive component further comprises at least one material selected from the group consisting of barium sulfate, talc, and boron nitride.

13. The liquid composition according to claim 11,
    wherein a content of the thermally conductive component is in a range from 20 to 200 parts by mass based on 100 parts by mass of the resin for forming a film.

14. The liquid composition according to claim 11,
    wherein the resin for forming a film is at least one solvent-soluble resin selected from the group consisting of an acrylic resin, a urethane-based resin, a urea-based resin, an epoxy-based resin, a rubber-based resin, a fluorine-based resin, a polyamide-based resin, a polyimide-based resin, a silicone-based resin, a cellulose-based resin, and a thermoplastic elastomer.

15. A thermally conductive thin film formed by coating with the liquid composition according to claim 11.

16. A member for an electronic device, the member comprising:
a member made of a metal; and
the thermally conductive thin film according to claim 15 disposed on a surface of the member made of a metal.

17. An alumina-based thermally conductive oxide comprising a fired and pulverized product of a starting material mixture,
wherein the starting material mixture comprises:
an aluminum starting material, the aluminum starting material comprising:
at least one material selected from the group consisting of boehmite, aluminum hydroxide, and alumina, wherein a shape of the aluminum starting material is a particle having a number average particle diameter in a range from 0.1 to 80 μm; and
an additional starting material, wherein the additional starting material consists of:
a boric acid compound;
an oxide starting material (A); and
an oxide starting material (B),
wherein the oxide starting material (A) in the additional starting material is
(a) at least one compound selected from the group consisting of a tungsten compound, a bismuth compound, a titanium compound, a phosphorus compound, a zinc compound, and a cerium compound, or
(b) a frit, or a mixture of the frit and the at least one compound (a),
wherein the at least one compound (a) of the oxide starting material (A) is in at least one form selected from the group consisting of a metal oxide, a hydroxide, an oxoate, a carbonate, a bicarbonate, and an ammonium salt, or is at least one salt compound selected from the group consisting of sodium tungsten and sodium phosphate, or a combination of the at least one salt compound with the at least one compound (a) in the at least one form,
the oxide starting material (B) is at least one material selected from the group consisting of iron, cobalt, copper, manganese, nickel, chromium, and mixtures thereof,
in the starting material mixture, a content of the boric acid compound is in a range from 0.1 to 5 parts by mass, and a content of the oxide starting material (A) is in a range from 0.1 to 20 parts by mass, each based on 100 parts by mass of the aluminum starting material,
if the oxide starting material (A) is the frit or one of the mixtures that contain the frit, the frit is a non-colored grade frit that does not contain Pb and the non-colored grade frit consists of: Si; and at least one element selected from the group consisting of Li, B, Na, K, Mg, Ca, Al, Zn, F, Ti, Zr, and P,
the alumina-based thermally conductive oxide is colored,
in the alumina-based thermally conductive oxide, a fired product of the particles of the aluminum starting material bound to each other by the boric acid compound and the oxide starting material (A) in the additional starting material are present, and
the additional starting material smoothens a surface of the alumina-based thermally conductive oxide, when being fired.

* * * * *